(12) United States Patent
Sakimura et al.

(10) Patent No.: US 7,440,314 B2
(45) Date of Patent: Oct. 21, 2008

(54) TOGGLE-TYPE MAGNETORESISTIVE RANDOM ACCESS MEMORY

(75) Inventors: Noboru Sakimura, Tokyo (JP); Tadahiko Sugibayashi, Tokyo (JP); Takeshi Honda, Tokyo (JP)

(73) Assignee: NEC Corporation, Tokyo (JP)

( * ) Notice: Subject to any disclaimer, the term of this patent is extended or adjusted under 35 U.S.C. 154(b) by 81 days.

(21) Appl. No.: 10/591,617

(22) PCT Filed: Mar. 2, 2005

(86) PCT No.: PCT/JP2005/003482

§ 371 (c)(1),
(2), (4) Date: Sep. 5, 2006

(87) PCT Pub. No.: WO2005/086170

PCT Pub. Date: Sep. 15, 2005

(65) Prior Publication Data

US 2007/0195585 A1    Aug. 23, 2007

(30) Foreign Application Priority Data

Mar. 5, 2004    (JP)    ............................. 2004-061595

(51) Int. Cl.
*G11C 11/14* (2006.01)
*G11C 11/15* (2006.01)
*G11C 7/14* (2006.01)

(52) U.S. Cl. .................. 365/158; 365/171; 365/173; 365/210.1

(58) Field of Classification Search .................. 365/158, 365/171, 173, 207, 210, 210.1, 189.14, 189.15, 365/189.16
See application file for complete search history.

(56) References Cited

U.S. PATENT DOCUMENTS

| | | | | |
|---|---|---|---|---|
| 6,104,633 A | * | 8/2000 | Abraham et al. | 365/171 |
| 6,317,376 B1 | * | 11/2001 | Tran et al. | 365/210 |
| 6,392,923 B1 | | 5/2002 | Naji | |
| 6,438,025 B1 | * | 8/2002 | Skarupo | 365/158 |
| 6,490,192 B2 | * | 12/2002 | Thewes et al. | 365/158 |
| 6,545,906 B1 | | 4/2003 | Savtchenko et al. | |
| 2002/0145902 A1 | * | 10/2002 | Kunikiyo et al. | 365/97 |

(Continued)

FOREIGN PATENT DOCUMENTS

JP    2001-184857    7/2001

(Continued)

*Primary Examiner*—J. H. Hur
(74) *Attorney, Agent, or Firm*—Scully, Scott, Murphy & Presser PC

(57) ABSTRACT

A MRAM includes: first wirings, second wirings, memory cells, a second sense amplifier and a first sense amplifier. The first wirings and second wirings are extended in a first and a second direction. The memory cells are placed correspondingly to positions where the first wirings are crossed with the second wirings. The second sense amplifier detects a state of a reference cell on the basis of an output from the reference cell provided by corresponding to a reference wiring. The first sense amplifier (2) detects a state of the memory cell on the basis of an output from the reference cell and an output from the memory cell. The memory cell includes a magnetic tunneling junction element having a laminated free layer. The magnetic tunneling junction element has a magnetization easy axis direction which is different from the first and second directions.

18 Claims, 19 Drawing Sheets

U.S. PATENT DOCUMENTS

2004/0004856 A1* 1/2004 Sakimura et al. ............ 365/158
2004/0008536 A1* 1/2004 Garni et al. ................. 365/171

FOREIGN PATENT DOCUMENTS

| JP | 2001-250999 | 9/2001 |
| JP | 2002-140889 | 5/2002 |
| JP | 2003-151262 | 5/2003 |
| JP | 2003-257173 | 9/2003 |
| JP | 2004-39150 | 2/2004 |
| WO | WO 03/034437 A2 | 4/2003 |
| WO | WO 03/043018 A1 | 5/2003 |

* cited by examiner

Fig. 18

| ID | REFERENCE INFORMATION | Q1 | Q2 | DOUT | TG2EN | TGERR |
|---|---|---|---|---|---|---|
| 1 | 0 | 0 | 0 | 0 | 1 | 0 |
| 2 | 0 | 0 | 1 | X | 0 | 1 |
| 3 | 0 | 1 | 0 | X | 0 | 1 |
| 4 | 0 | 1 | 1 | 1 | 0 | 0 |
| 5 | 1 | 0 | 0 | 0 | 0 | 0 |
| 6 | 1 | 0 | 1 | X | 0 | 1 |
| 7 | 1 | 1 | 0 | X | 0 | 1 |
| 8 | 1 | 1 | 1 | 1 | 1 | 0 |

TOGGLE-TYPE MAGNETORESISTIVE RANDOM ACCESS MEMORY

TECHNICAL FIELD

The present invention relates to a toggle-type magnetoresistive random access memory, and more particularly relates to a toggle-type magnetoresistive random access memory to improve reliability of a reference cell.

BACKGROUND ART

A magnetoresistive random access memory (hereinafter referred to as an MRAM) is known, which stores data by controlling a magnetization direction of a memory element. The MRAM has several types depending on a memory method of a magnetization direction.

A first prior art (U.S. Pat. No. 6,545,906) discloses a technique of a toggle-type magnetoresistive random access memory (hereinafter referred to as a toggle MRAM). This toggle MRAM employs a magnetic tunneling junction (MTJ) element in which a laminated free layer is used for a memory element thereof. The toggle MRAM is different from a conventional and typical MRAM in terms of a memory cell configuration and a principle of a write operation, and characterized by a property of excellent selectivity of a memory cell in a write operation. Details will be explained below.

FIGS. 1 and 2 are cross sectional views showing configurations of typical magnetic tunneling junction elements used for the toggle MRAM. This magnetic tunneling junction element 125 is provided between a first wiring 110 and a second wiring 101. The magnetic tunneling junction element 125 includes an anti-ferromagnetic layer 109, a pin layer 108, a non-magnetic metal layer 107, a reference layer 106, a tunnel layer 105, a first free layer 104, a non-magnetic metal layer 103, and a second free layer 102 on the first wiring 110 in this order, and is connected to the second wiring 101.

The magnetic tunneling junction element 125 is characterized in that the first free layer 104 and the second free layer 102 are equal in a film thickness and are laminated through the non-magnetic metal layer 103. The pin layer 108 and the reference layer 106 are also laminated through the non-magnetic metal layer 107. A magnetization direction of the pin layer 108 and the reference layer 106 is firmly fixed at the time of fabrication. A magnetic field generated by write currents flowing in the first wiring 110 and the second wiring 101 is capable of changing a first free layer magnetization direction belonging to the first free layer 104 and a second free layer magnetization direction belonging to the second free layer 102. The first and second free layer magnetization directions are stable in an anti-parallel state by being inverted for 180 degrees from each other. If one of the free layer magnetization directions is reversed, the other free layer magnetization direction should be reversed so as to retain the anti-parallel state.

A sense operation principle in the toggle MRAM is the same as a sense operational principle in the conventional and typical MRAM. That is, the sense operation is carried out by detecting a tunnel current passing through the tunnel film 105 provided between the first free layer 104 and the reference layer 106. If the first free layer magnetization direction is in the parallel state to a reference layer magnetization direction belonging to the reference layer 106, the tunnel current is increased in comparison with the anti-parallel state, which means a magnetoresistance (MTJ resistance) is decreased. Information stored in the memory cell is read out by utilizing this characteristic. For convenience of explanation, it is defined as "1" if the magnetoresistance has a high resistance value Rmax (tunnel current mm.) (FIG. 1, and it is defined as "0" if the magnetoresistance has a low resistance value Rmin (tunnel current max.) (FIG. 2).

In a conventional MRAM disclosed in a second prior art (U.S. Pat. No. 6,392,923), for example, a reference cell is constituted by using a plurality of memory cells that are programmed in advance so that a combined resistance value Rref is made to be Rmin<Rref<Rmax. Information stored in the memory cells is sensed at a high speed by comparing a resistance value of a selected memory cell with the resistance value Rref of the reference cell.

According to the first prior document, a plane layout of the memory cell of the toggle MRAM is different from that of the conventional and typical MRAM. FIG. 3 is a top surface view showing the plane layout of the memory cell in the first prior document. The toggle MRAM is characterized in that a magnetization easy axis direction of a magnetic tunneling junction element is arranged in neither an X direction to which the first wiring ((write) word line) extends nor a Y direction to which the second wiring (bit line) extends, and arranged so as to be in about 45° direction from the X and Y directions. This is in consideration of allowing a toggle operation mentioned below to be carried out easily.

The write operation principle of a toggle MRAM, which is different from that of the conventional and typical MRAM, will be explained next. In a write operation of the conventional and typical MRAM, a free layer magnetization direction is determined by controlling a write current direction of a bit line in accordance with information to be written. On the other hand, in the write operation of the toggle MRAM disclosed in the first prior art, a read-out operation is executed in a selected memory cell in advance, and then, whether or not to change the first and second free layer magnetization directions (whether or not to execute the toggle operation) is determined based on the read-out information and the information to be written. That is, the toggle operation will not be executed if the read-out information ("0" or "1") is equal to the information to be written ("0" or "1"), and the toggle operation will be executed if the read-out information is different from the information to be written.

FIGS. 4 to 6 are diagrams showing the toggle operation principle in the toggle MRAM according to the first prior art. FIG. 4 is a timing chart showing a timing of a write current $I_{WL}$ and a write current $I_{BL}$ in the toggle operation. FIGS. 5 and 6 are diagrams showing changes of the first and second free layer magnetization directions in the toggle operation. Thin arrows indicate the second free layer magnetization direction and thick arrows indicate the first free layer magnetization direction. FIG. 5 is the case that a data "1" is being written to the magnetic tunneling junction element in which data "0" is stored. FIG. 6 is the case that a data "0" is being written to the magnetic tunneling junction element in which data "1" is stored.

Referring to FIG. 3, in the toggle operation, the write current $I_{WL}$ is supplied to the write word line at a time t1. The write current $I_{BL}$ is supplied to the bit line at a time t2. The write current $I_{WL}$ is stopped at a time t3. Then, the write current $I_{BL}$ is stopped at a time t4. A series of the current controls mentioned above causes a rotating magnetic field to be applied at a cross point between a selected (write) word line to which the write current $I_{WL}$ is supplied and a selected bit line to which the write current $I_{BL}$ is supplied, enabling to write data by rotating (changing) the first and second free layer magnetization directions.

Referring to FIGS. 5 and 6, in the magnetic tunneling junction element, the first and second free layer magnetization directions start rotate at the time t1. One of the first and second free layer magnetization directions exceeds a magnetization difficult axis at the time t2. Another of the first and second free layer magnetization directions also exceeds the magnetization difficult axis at the time t3. In this manner, the first and second free layer magnetization directions are thus made one revolution, respectively, in a spin flop state. That is, the magnetic tunneling junction element is rewritten (toggled) to bring a state of "1" if an initial state thereof is "0", and to bring a state of "0" if an initial state thereof is "1".

FIG. 7 is a graph showing a relationship among the write current $I_{WL}$, the write current $I_{BL}$ and the memory cell (magnetic tunneling junction element) to be toggled. A vertical axis indicates the write current $I_{WL}$ and a horizontal axis indicates the write current $I_{BL}$. A solid circle corresponds to the selected cell, open circles correspond to a half selected cell (a cell of which any one of the write word line and the bit line is in a common with the selected cell), and an X mark corresponds to a non-selected cell. A region shown as "TOGGLE" means a region in which the toggle operation is observed. A region shown as "No Switching" means a region in which the toggle operation is not observed.

The toggle MRAM has a very low possibility of making an error writing because the magnetic field is applied only in a single direction to a memory cell in the half selected state (the open circles in the figure) placed on the selected (write) word line or the selected bit line. Therefore, it is not necessary to strictly control a value of the write current, and a write margin is significantly improved in comparison with the conventional and typical MRAM.

As explained above, the write operation in a typical MRAM is executed by controlling the free layer magnetization of the magnetic tunneling junction element by the write current direction corresponding to information to be written. On the other hand, in the case of the toggle MRAM, the write operation is executed by whether or not to reverse (to toggle) the free layer magnetization directions. It is therefore necessary to sense stored information of the selected memory cell before executing the toggle operation. The sense operation in a general cell placed in a user area is executed by comparing a resistance value of a selected cell with a resistance value of a reference cell. Accordingly, the write operation in the general cell is capable if it is decided whether or not to execute the toggle operation on the basis of the information to be written and the latest sense result. Meanwhile, it is necessary to write (program) known reference information in advance with high reliability to the reference cell which becomes a reference of a general cell at the time of supplying a power source or the like. However, because reference information required writing the reference cell does not exist, it is impossible to sense the stored information in the same manner with the general cell.

In conjunction with the above technique, an information reproducing method is disclosed in Japanese Laid Open Patent Application JP 2002-140889A. This technique is an information reproducing method from a ferromagnetic memory including a variable resistor composed with magnetic material. The variable resistor includes a hard layer to store information by a magnetization direction, a non-magnetic layer, and a soft layer composed with magnetic material having a smaller coercive force than that of the hard layer. The soft layer is first initialized while detecting and holding a resistance value of the variable resistor. When a magnetization of the soft layer is reversed next, the resistance value of the variable resistor is detected and compared with the resistance value which has been held, so that information stored in the hard layer is reproduced based on an increase or a decrease of the resistance value.

In conjunction with the above technique, a read-out circuit of a semiconductor memory device is disclosed in Japanese Laid Open Patent Application JP 2003-257173A. This technique is a read-out circuit of a semiconductor memory device in which a memory cell array is composed with memory cells having two memory states of a first memory state with a relatively small resistance value and a second memory state with a relatively large resistance value. The read-out circuit includes a pre-amplifier, a voltage control oscillator, a counter, count value memory means, and determination means. The pre-amplifier detects a current supplied from a selected cell which is selected among the memory cells, and amplified and converts the detected current to a voltage. The voltage control oscillator oscillates frequency proportional to the output voltage of the pre-amplifier. The counter counts the number of pulses supplied from the voltage control oscillator. The count value memory means stores an output value of the counter. The determination means receives the output value of the counter and that of the count value memory means, and determines a memory state of the selected cell.

DISCLOSURE OF INVENTION

An object of the present invention is to provide a toggle MRAM capable of writing (programming) reference information to a reference cell in the toggle MRAM with high reliability.

Other object of the present invention is to provide a toggle MRAM capable of reading (sensing) reference information from the reference cell in the toggle MRAM with high reliability.

In order to achieve an aspect of the present invention, the present invention provides a magnetoresistive random access memory of the present invention includes a plurality of first wirings, a plurality of second wirings, a plurality of memory cells, a second sense amplifier and a first sense amplifier. The plurality of first wirings is extended in a first direction. The plurality of second wirings is extended in a second direction that is substantially perpendicular to the first direction. Each of the plurality of memory cells is placed correspondingly to each of positions where the plurality of first wirings is crossed with the plurality of second wirings. The second sense amplifier detects a state of a reference cell on the basis of an output from the reference cell provided by corresponding to a reference wiring among the plurality of second wirings, among the plurality of memory cells. The first sense amplifier detects a state of one of the plurality of memory cells on the basis of an output from the reference cell and an output from the one of the plurality of memory cells, which is different from the reference cell. Each of the plurality of memory cells includes a magnetic tunneling junction element having a laminated free layer in which a magnetization direction is reversed correspondingly to data to be stored. The magnetic tunneling junction element has a magnetization easy axis direction which is different from the first and second directions.

In the magnetoresistive random access memory, a toggle operation to reverse a magnetization of the laminated free layer, for a selected cell as one of plurality of memory cells which corresponds to a selected first wiring selected among the plurality of first wirings and a selected second wiring selected among the plurality of second wirings, is executed by a following series of current controls. A first write current is supplied to the selected first wiring followed by a second write current to be supplied to the selected second wiring next, then, the first write current is stopped followed by the second write current to be stopped.

In the magnetoresistive random access memory, the first write current and the second write current are larger in the toggle operation executed for the reference cell than in the toggle operation executed for one of the plurality of memory cells which is different from the reference cell.

In the magnetoresistive random access memory, a stored information of the reference cell is read out by the following. A first read-out operation to detect a first state as an initial state of the reference cell, a first toggle operation to bring the reference cell into a second state by the toggle operation, a second read-out operation to detect the second state of the reference cell, and a second toggle operation to return the reference cell to the first state by the toggle operation, are executed, thereby stored information of the reference cell is read out on the basis of a comparison result between the first state and the second state.

In the magnetoresistive random access memory, a stored information of the reference cell is written by the following. A first read-out operation to detect a first state as an initial state of the reference cell, a first toggle operation to bring the reference cell into a second state by the toggle operation, a second read-out operation to detect the second state of the reference cell, and a determination operation to determine the first state and the second state on the basis of a comparison result between the first state and the second state, are executed, thereby the second state is retained if the second state is equal to the stored information to be written to the reference cell, and the toggle operation is executed to return the reference cell to the first state if the second state is different from the stored information to be written to the reference cell, for writing.

In the magnetoresistive random access memory, the second sense amplifier includes a resistance voltage converter, a storage unit and a determination unit. The resistance voltage converter detects a resistance value of the magnetic tunneling junction element of the reference cell so as to convert to an output voltage. The storage unit temporarily stores the output voltage. The determination unit determines the stored information which has been stored in the reference cell on the basis of the output voltage after the toggle operation and the output voltage before the toggle operation stored in the storage unit.

In the magnetoresistive random access memory, the storage unit includes: a first switch unit which is connected to an output side of the resistance voltage converter at an input side, and a capacitor which is connected to an output side of the first switch at an input side. The determination unit includes an inverter which is connected to an output side of the capacitor at an input side, and a second switch unit which is connected in parallel between an input and the output of the inverter.

In the magnetoresistive random access memory, both the first switch unit and the second switch unit are in an on state in the first read-out operation. The first switch unit is in an off state before starting the second read-out operation. The first switch unit is again brought into an on state immediately after the second switch unit is brought into an off state in the second read-out operation. An output of the inverter in the second read-out operation is the stored information of the reference cell.

In the magnetoresistive random access memory, the second sense amplifier detects whether or not the first toggle operation is executed, and increases the first write current and the second write current if it is determined that the first toggle operation is not executed to start from the first read-out operation again.

In the magnetoresistive random access memory, the second sense amplifier includes: a first resistance voltage converter, a first storage unit, a first determination unit, a second resistance voltage converter, a second storage unit, a second determination unit and a determination unit. The first resistance voltage converter detects a resistance value of the magnetic tunneling junction element of the reference cell as a first output voltage. The first storage unit temporarily stores the first output voltage. The first determination unit determines the stored information stored in the reference cell and outputs a determination result as a first signal on the basis of the first output voltage after the toggle operation and the first output voltage before the toggle operation stored in the first storage unit. The second resistance voltage converter detects a resistance value of the magnetic tunneling junction element of the reference cell as a second output voltage. The second storage unit temporarily stores the second output voltage. The second determination unit determines the stored information stored in the reference cell and outputs a determination result as a second signal on the basis of the second output voltage after the toggle operation and the second output voltage before the toggle operation stored in the second storage unit. The determination unit determines whether or not the first toggle operation has been executed on the basis of the first signal and the second signal.

In the magnetoresistive random access memory, the first output voltage in the first read-out operation is obtained by adding a first offset voltage to a voltage to which a detected resistance value of the magnetic tunneling junction element is converted. The first output voltage in the second read-out operation is obtained by detecting a resistance value of the magnetic tunneling junction element and converting it to a voltage. The second output voltage in the first read-out operation is obtained by adding a second offset voltage to a voltage to which a detected resistance value of the magnetic tunneling junction element is converted. The second output voltage in the second read-out operation is obtained by detecting a resistance value of the magnetic tunneling junction element and converting it to a voltage. A sign of the first offset voltage is opposite to that of the second offset voltage.

The magnetoresistive random access memory, the first output voltage in the first read-out operation is obtained by adding a first offset voltage to a voltage to which a detected resistance value of the magnetic tunneling junction element has been converted. The first output voltage in the second read-out operation is obtained by detecting a resistance value of the magnetic tunneling junction element and converting it to a voltage. The second output voltage in the first read-out operation is obtained by detecting a resistance value of the magnetic tunneling junction element and converting it to a voltage. The second output voltage in the second read-out operation is obtained by adding a second offset voltage to a voltage to which a detected resistance value of the magnetic tunneling junction element has been converted. A sign of the first offset voltage is equal to that of the second offset voltage.

The magnetoresistive random access memory, the first storage unit includes: a first switch unit which is connected to an output side of the first resistance voltage converter at an input side, and a first capacitor which is connected to an output side of the first switch unit at an input side. The first determination unit includes a first inverter which is connected to an output side of the first capacitor at an input side, and a second switch unit which is connected in parallel between an input and an output of the first inverter. The second storage unit includes: a third switch unit which is connected to an output side of the first resistance voltage converter at an input side, and a second capacitor which is connected to an output side of the third switch at an input side. The second determination unit includes a second inverter which is connected to an output side of the second capacitor at an input side, and a forth switch unit which is connected in parallel between an input and an output of the second inverter.

The magnetoresistive random access memory, the first switch unit, the second switch unit, the third switch unit and the forth switch unit are in an on state in the first read-out operation. The first switch unit and the third switch unit are in an off state before starting the second read-out operation. The first switch unit and the third switch unit are brought into an on state again immediately after the second switch unit and the fourth switch unit are brought into an off state in the second read-out operation. An output of the determination unit in the second read-out operation is the stored information of the reference cell.

According to the toggle MRAM of the present invention, it is possible to securely read out information stored in the reference cell. Desired reference information can be written in advance in the reference cell when shipping, power supplying, and even using.

BRIEF DESCRIPTION OF THE DRAWINGS

FIG. 18 is a truth table of a determination circuit;

BEST MODE FOR CARRYING OUT THE INVENTION

Embodiments of a toggle MRAM according to the present invention will be explained below with reference to the attached drawings.

First Embodiment

A configuration of a first embodiment of a toggle MRAM will be explained referring to the attached drawings.

Figure 8:
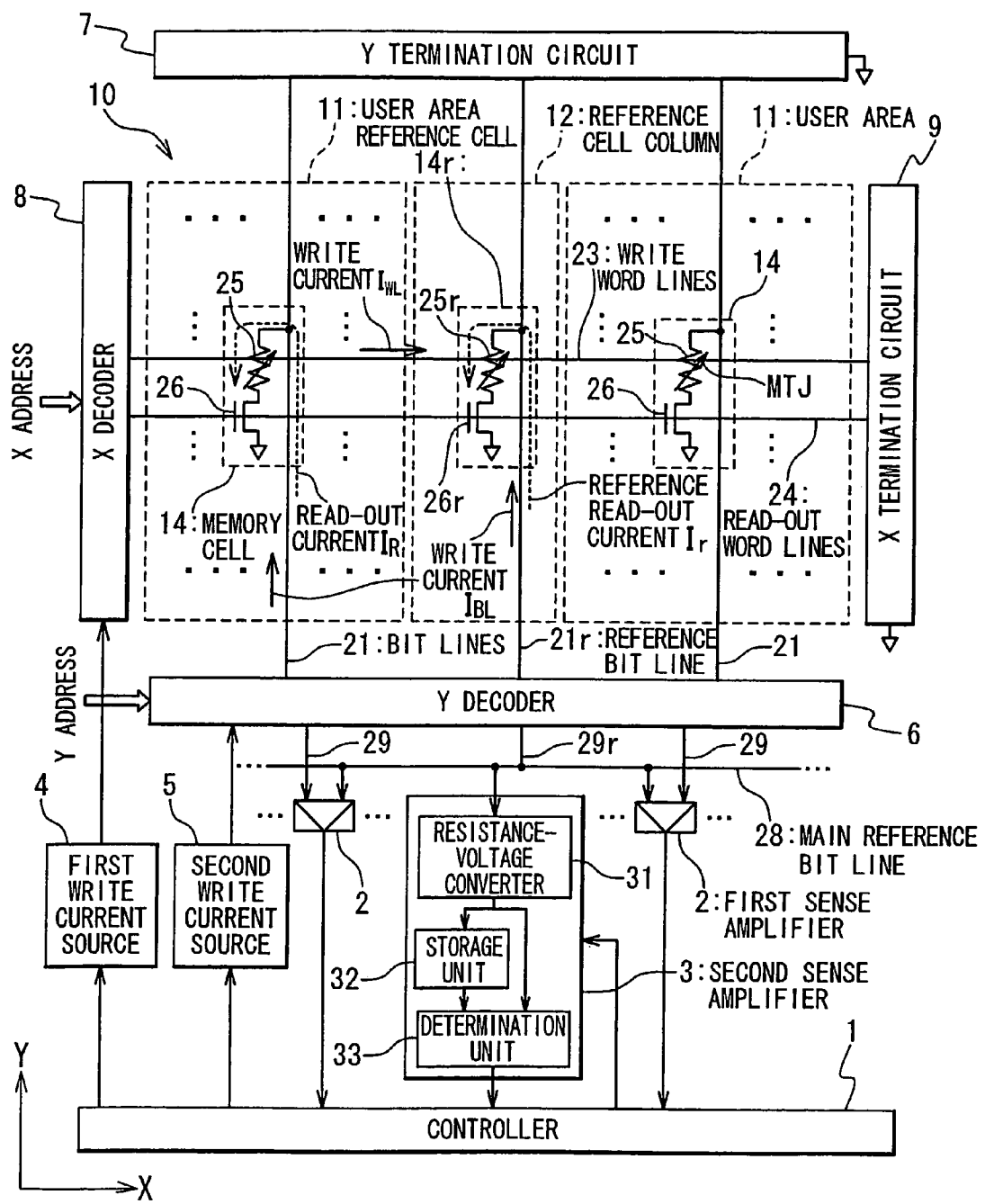
FIG. 8 is a block diagram showing a configuration of a first embodiment of a toggle MRAM according to the present invention.

FIG. 8 is a block diagram showing a configuration of the first embodiment of the toggle MRAM according to the present invention. The toggle MRAM includes a controller 1, a first sense amplifier 2, a second sense amplifier 3, a first write current source 4, a second write current source 5, a Y decoder 6, a Y termination circuit 7, an X decoder 8, an X termination circuit 9, a cell array 10, a plurality of write word lines 23, a plurality of read-out word lines 24, a plurality of bit lines 21, a reference bit line 21r, a main reference bit line 28, and a plurality of main bit lines 29.

Figure 1:
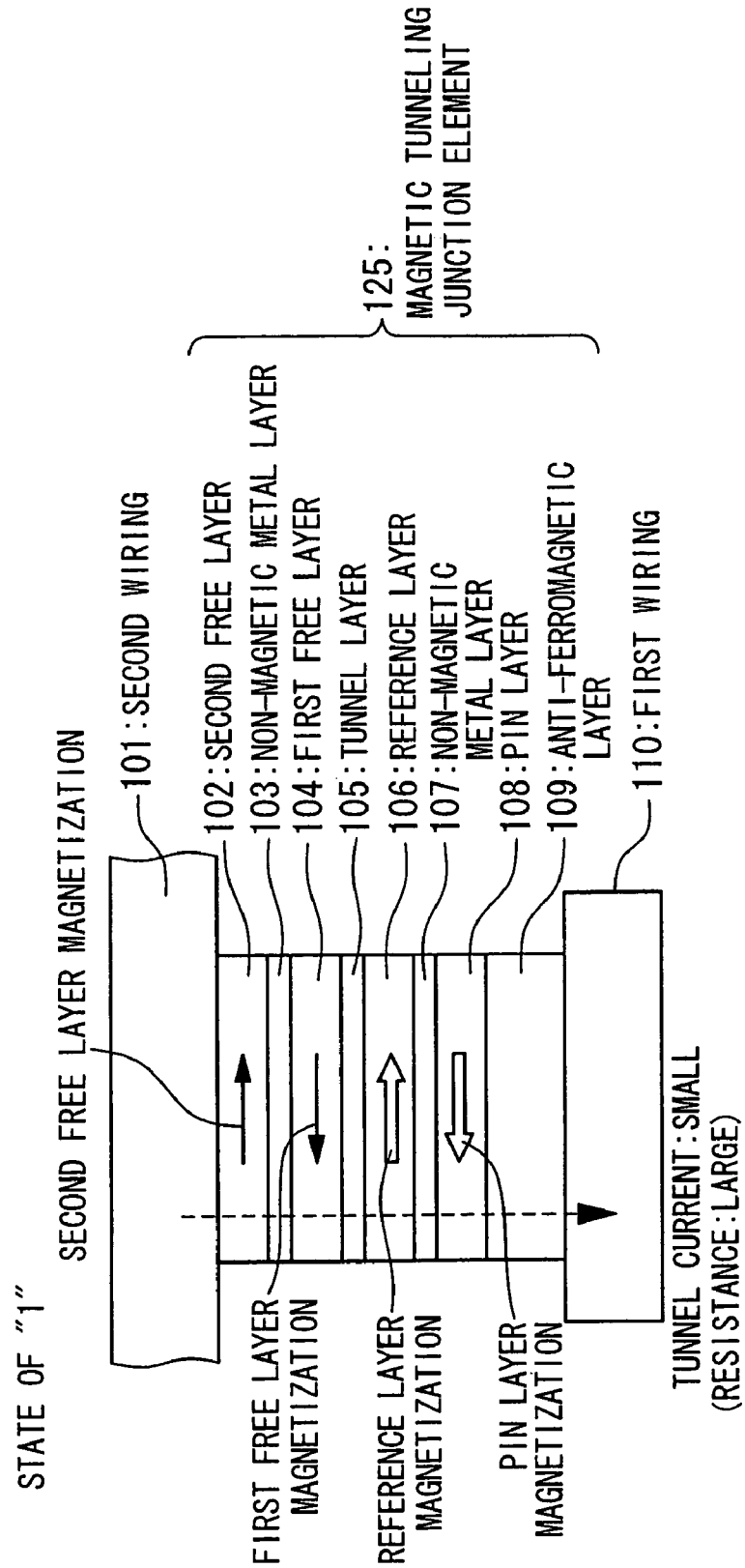
FIG. 1 is a cross sectional view showing a configuration of a typical magnetic tunneling junction element used in a toggle MRAM.
Figure 2:
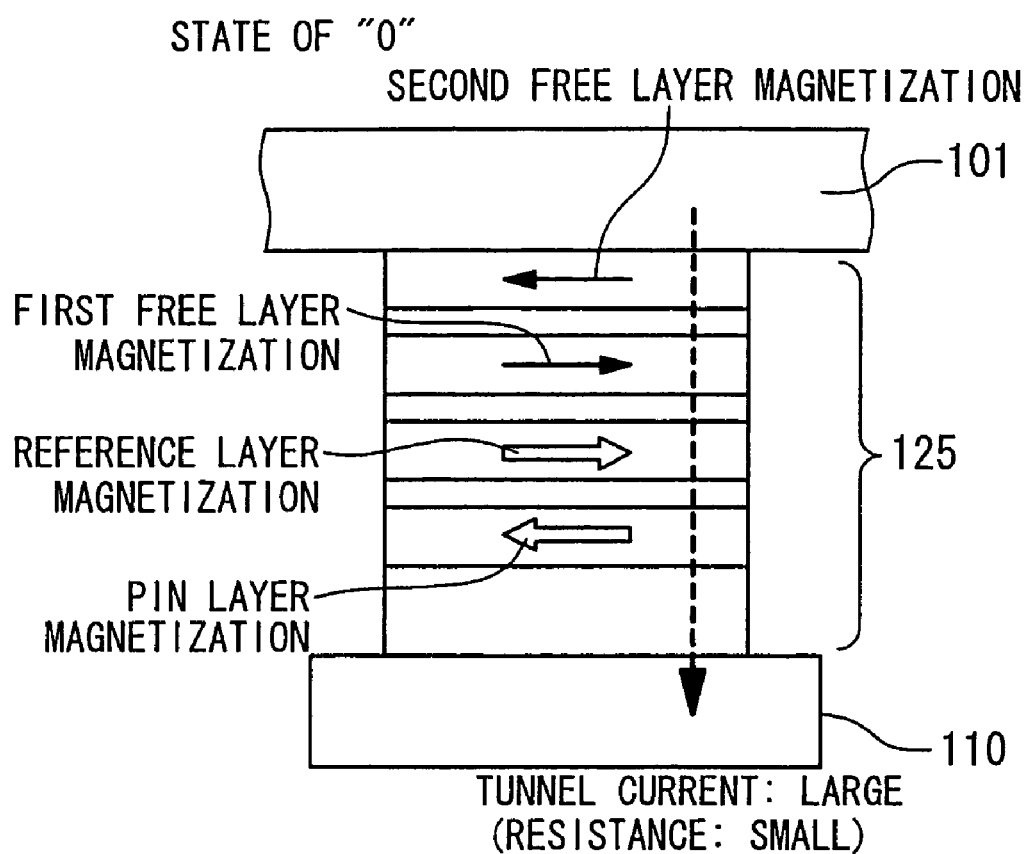
FIG. 2 is a cross sectional view showing a configuration of the typical magnetic tunneling junction element used in the toggle MRAM.
Figure 3:
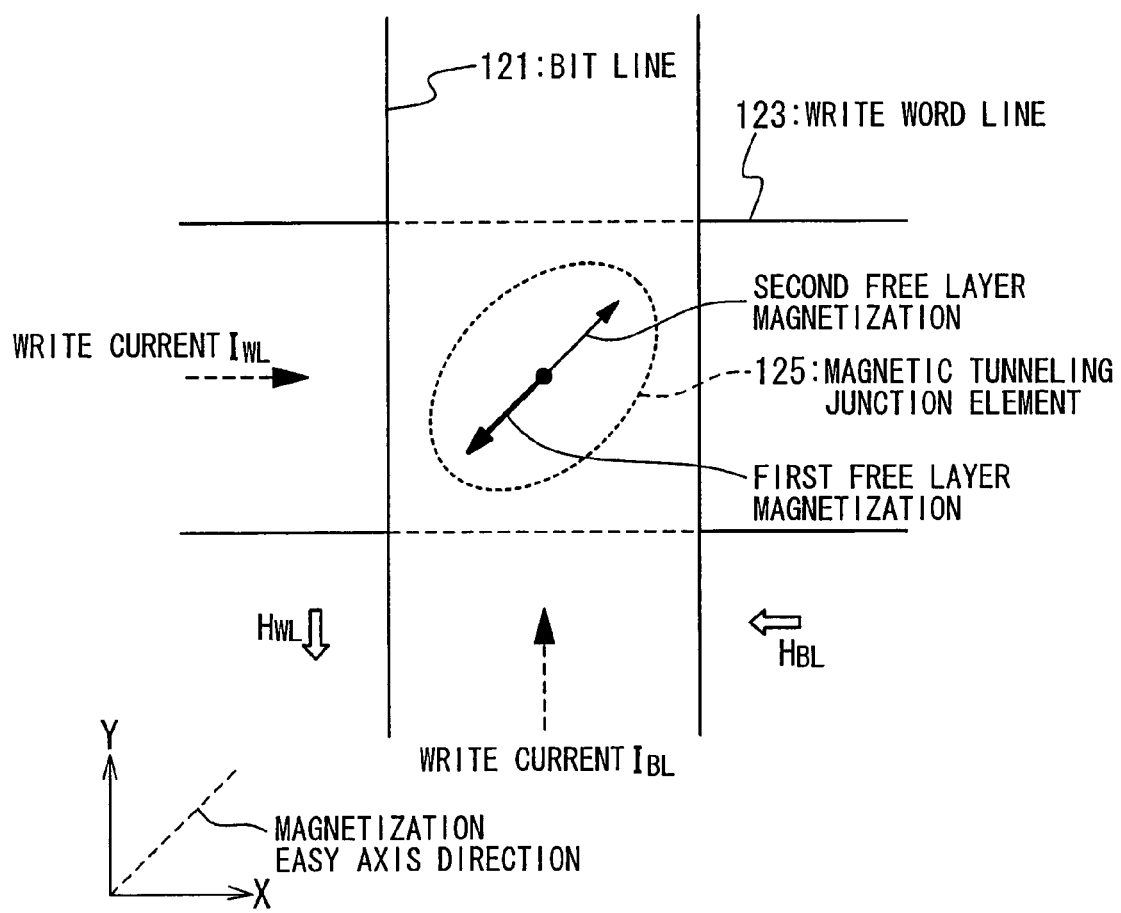
FIG. 3 is a top surface view showing a plane layout of a memory cell in a first prior document.

The cell array 10 includes a user area 11 and a reference cell column. A plurality of memory cells 14 is arrayed into a matrix form in the user area 11. The memory cell 14 includes a magnetic tunneling junction element 25 and a MOS transistor 26. One end of the magnetic tunneling junction element 25 is connected to the bit line 21 and the other end of the magnetic tunneling junction element 25 is connected to a drain of the transistor 26. The magnetic tunneling junction element 25 has a spontaneous magnetization in which a magnetization direction is reversed by corresponding to data to be stored. More details of the magnetic tunneling junction element 25 are shown in FIGS. 1 to 3. The magnetic tunneling junction element 25 is placed in a position to receive an effect of a magnetic field accompanied by a write current $I_{WL}$ which flows in the write word line 23 and a magnetic field accompanied by a write current $I_{BL}$ which flows in the bit line 21. The drain of the MOS transistor 26 is connected to the magnetic tunneling junction element 25, a source thereof is grounded, and a gate thereof is connected to the read-out word line 24. The MOS transistor 26 is used to cause a current to flow in a path from the bit line 21 to the ground through the magnetic tunneling junction element 25 (and the transistor 26), in the read-out operation.

In the reference cell column, a plurality of reference cells 14r are arrayed along the reference bit line 21r. The reference cell 14r has the same configuration with the memory cell 14 except for being arrayed along the reference bit line 21r, and includes a magnetic tunneling junction element 25r and an MOS transistor 26r.

The bit line 21 is placed so as to extend in a Y axis direction (a bit line direction) as a first direction, in which one end thereof is connected to the Y decoder 6 and the other end thereof is connected to the Y termination circuit 7. It is the same in the reference bit line 21r.

The write word line 23 is placed so as to extend in an X axis direction (a word line direction) as a second direction which is substantially perpendicular to the Y axis direction, in which one end thereof is connected to the X decoder 8 and the other end thereof is connected to the X termination circuit 9. The read-out word line 24 is placed so as to extend in the X axis direction (the word line direction) as the second direction, in which one end thereof is connected to the X decoder 8 and the other end thereof is connected to the X termination circuit 9.

The memory cell 14 is placed in a position corresponding to each of positions where the plurality of the bit lines 21 is crossed with a plurality of pairs of the write word line 23 and the read-out word line 24. The memory cell 14r is placed in a position corresponding to each of positions where the plurality of the bit lines 21r is crossed with a plurality of pairs of the write word line 23 and with the read-out word line 24.

The Y decoder 6 selects a single bit line 21, as a selected bit line 21s, among the plurality of the bit lines 21 and selects the reference bit line 21r on the basis of an input of a Y address in both cases of the read-out operation and the write operation of the memory cell 14. The Y decoder 6 also selects the reference bit line 21r on the basis of an input of a Y address in both cases of the read-out operation and the write operation of the reference cell 14r.

The X decoder 8 selects a single read-out word line 24, as a selected read-out word line 24s, among the plurality of the read-out word lines 24 on the basis of an input of an X address in the read-out operation of the memory cell 14 and the reference cell 14r. The X decoder 8 selects a single write word line 23, as a selected write word line 23s, among the plurality of the write word lines 23 on the basis of an input of an X address in the write operation of the memory cell 14 and the reference cell 14r.

A memory cell 14 selected by the selected bit line 21s and the selected write word line 23s or the selected read-out word line 24s is made to be a selected cell 14s. A reference cell 14r selected by the reference bit line 21r and the selected write word line 23s or the selected read-out word line 24s is made to be a selected reference cell 14rs.

The first write current source 4 supplies a predetermined write current $I_{WL}$ to the selected write word line 23s in the write operation of the memory cell 14 and the reference cell 14r. The X termination circuit 9 terminates the write current $I_{WL}$ which flows in the selected write word line 23s in the write operation of the memory cell 14 and the reference cell 14r.

The second write current source 5 supplies a predetermined write current $I_{BL}$ to the selected bit line 21s in the write operation of the memory cell 14 and the reference cell 14r. The Y termination circuit 7 terminates the write current $I_{BL}$ which flows in the selected bit line 21s in the write operation of the memory cell 14 and the reference cell 14r.

The first sense amplifier 2 compares a read-out current $I_R$ which flows from the main bit line 29 to the selected memory cell 14s through the Y decoder 6 and the selected bit line 21s, with a reference read-out current Ir which flows from the main reference bit line 28 to the selected reference cell 14rs through the Y decoder 6 and the reference bit line 21r, thereby a state of the selected memory cell 14s is detected. Data of the selected memory cell 14s is thus read out.

The second sense amplifier 3 compares a reference read-out current Ir which flows from the main reference bit line 28 to the selected reference cell 14rs through the Y decoder 6 and the reference bit line 21r, with a reference read-out current Ir after a single toggle operation is executed for the selected reference cell 14rs, thereby a state of the reference cell 14r is detected. Date of the reference cell 14r is thus read out.

The main bit line 29 connects the selected bit line 21s in each of the user areas with the first sense amplifier 2.

The main reference bit line 28 connects the reference bit line 21r with the first sense amplifier 2 and the second sense amplifier 3.

The controller 1 controls the first sense amplifier 2, the second sense amplifier 3, the first write current source 4 and the second write current source 5 on the basis of the write operation and the read-out operation of data.

The toggle MRAM of the present invention includes the second sense amplifier 3 exclusively used for detecting the stored information of the reference cell, in addition to the first sense amplifier 2 generally used for detecting stored information of the general memory cell 14. The first sense amplifier 2 reads the stored information of the selected memory cell 14s by comparing a state of the selected memory cell 14s with a state of the selected reference cell 14rs. On the other hand, the second sense amplifier 3 is capable of reading the stored information of the reference cell 14r by comparing two states of the reference cell 14r before and after the toggle operation. Therefore, it is possible to program reference information in the reference cell 14r with high reliability. In addition, it is possible to secure a signal amount of the second sense amplifier 3 twice as much as a signal amount of the first sense amplifier 2 in the user area 11, in which a highly reliable sense result is provided and programming of the reference cell 14r with higher reliability is made possible.

The second sense amplifier 3 includes a resistance-voltage converter 31, a storage unit 32 and a determination unit 33. The resistance-voltage converter 31 detects a resistance value (a current value) of the magnetic tunneling junction element 25r of the reference cell 14r, and converts it to a voltage. The storage unit 32 temporarily stores the output voltage of the resistance-voltage converter 31. The determination unit 33 determines information stored in the reference cell 14r from a present output voltage of the resistance-voltage converter 31 and an output voltage of the storage unit 32 (a previous output voltage of the resistance-voltage converter 31).

Figure 4:
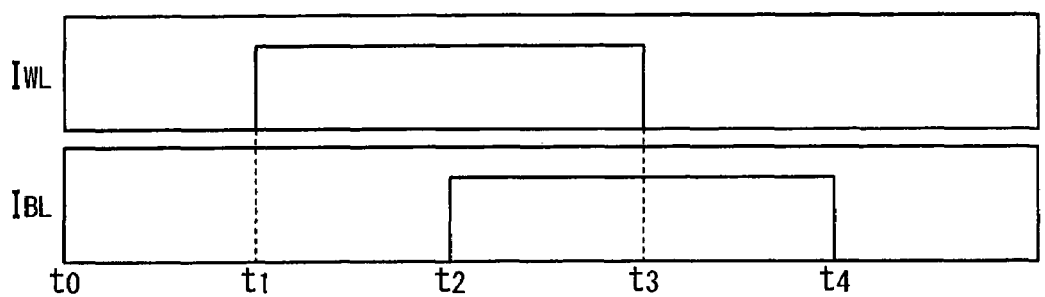
FIG. 4 is a timing chart showing a timing of a write current $I_{WL}$ and a write current $I_{BL}$ in a toggle operation.
Figure 5:
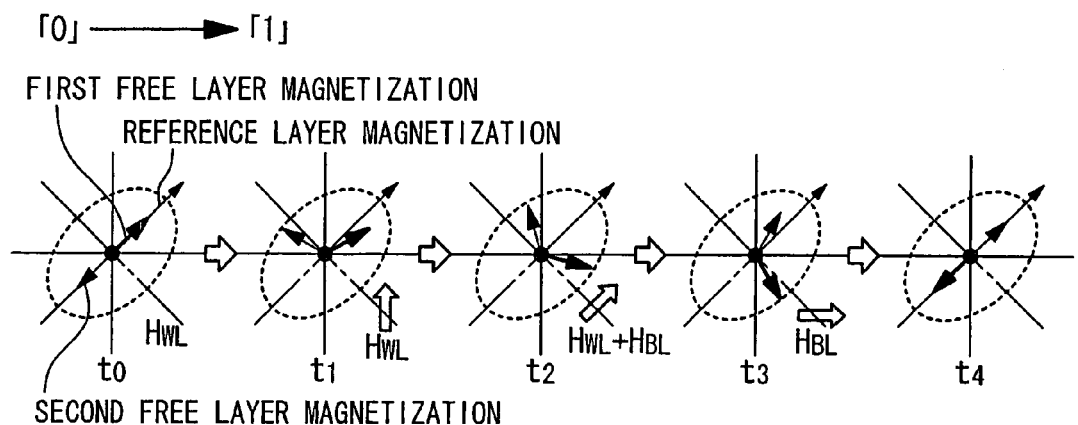
FIG. 5 is a view showing a change of first and second free layer magnetization directions in the toggle operation.
Figure 6:
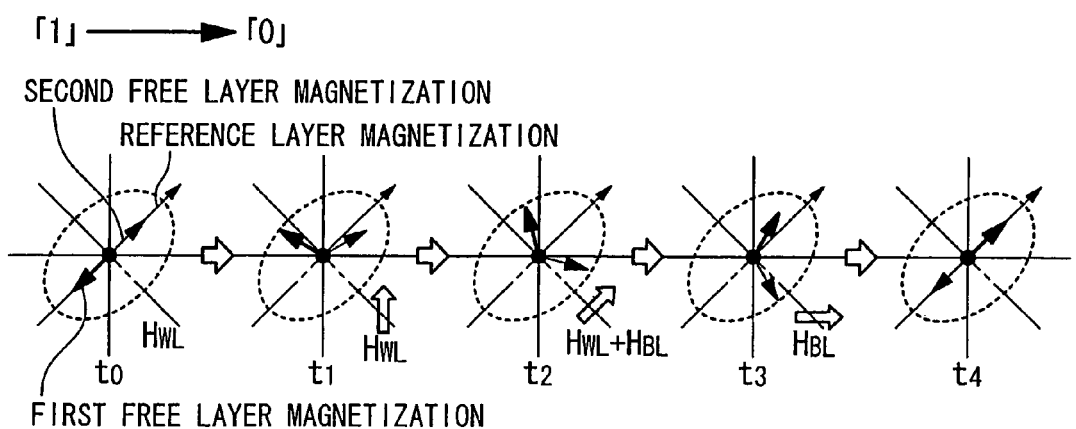
FIG. 6 is a view showing a change of the first and second free layer magnetization directions in the toggle operation.
Figure 7:
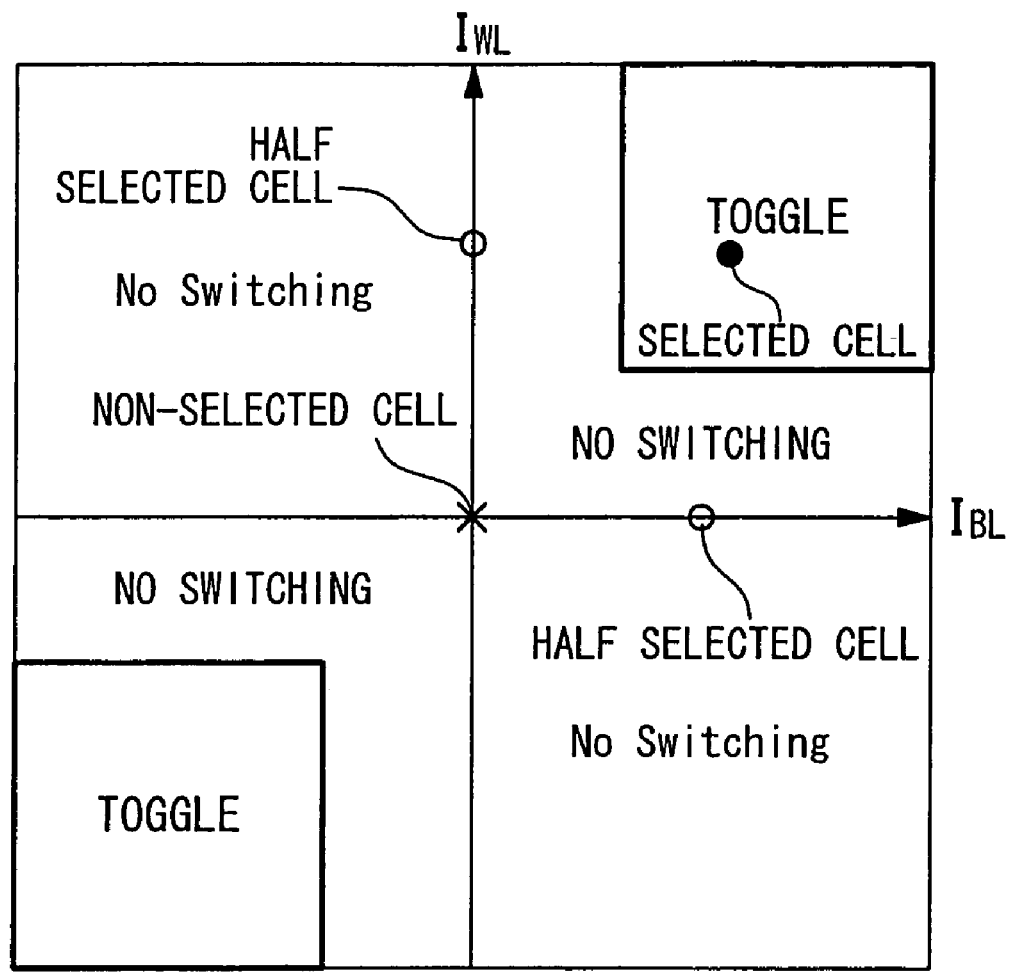
FIG. 7 is a graph showing a relationship among the write current $I_{WL}$, the write current $I_{BL}$ and a memory cell (magnetic tunneling junction element) to be toggled.

The present invention relates to a read-out (sense) operation and a write (program) operation of the reference cell 14r in the toggle MRAM. A general read-out operation and a write operation of the memory cell 14 are similar to those of a conventional toggle MRAM (similar to the explanations in FIGS. 4 to 6), thereby explanations thereof will be omitted.

An operation of the first embodiment of the toggle MRAM according to the present invention will be explained next referring to the attached drawings.

Figure 9:
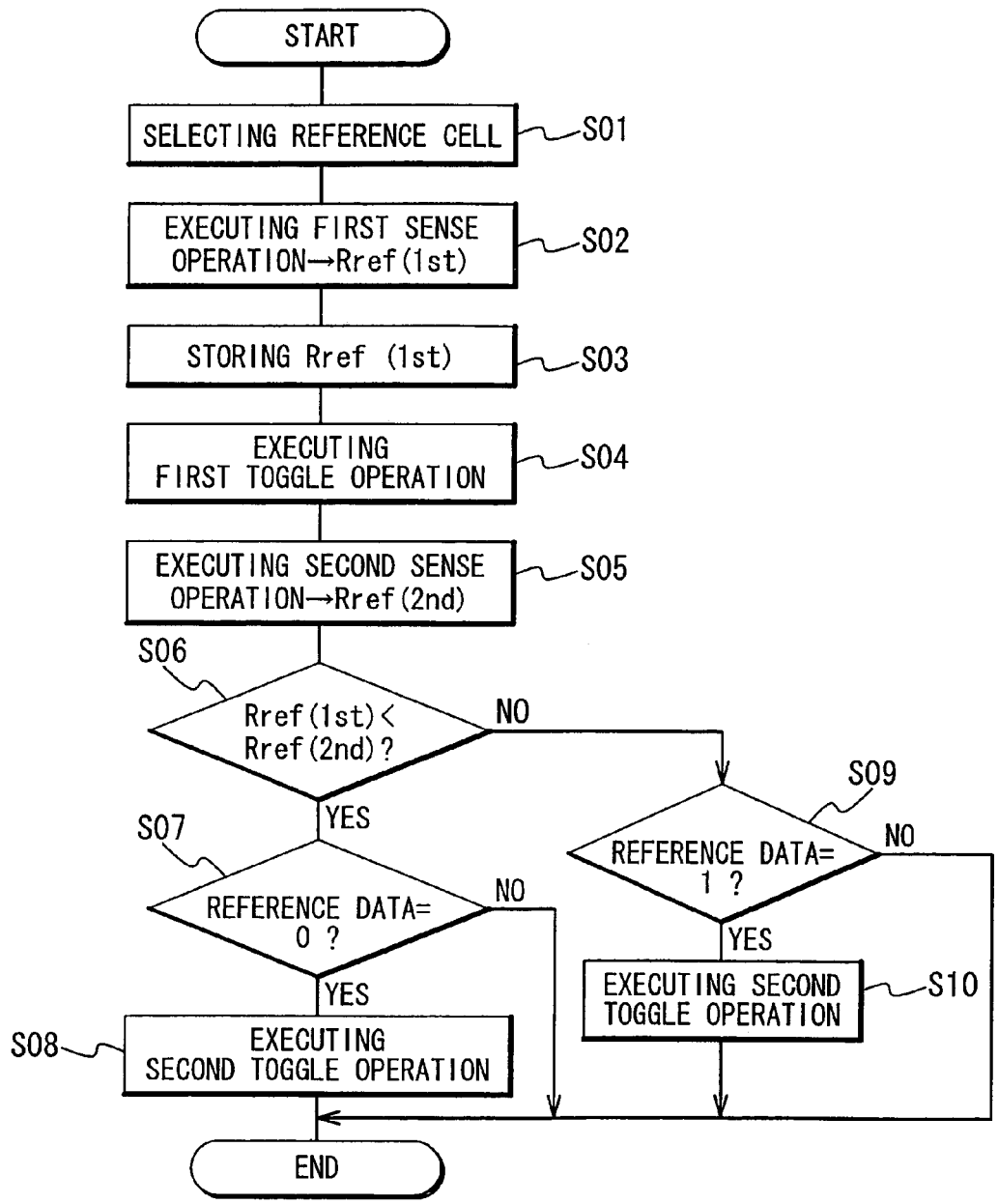
FIG. 9 is a flowchart showing a write operation of the first embodiment of the toggle MRAM according to the present invention.

FIG. 9 is a flowchart showing an operation of the first embodiment of the toggle MRAM according to the present invention. FIG. 9 indicates a program method (a write method) of the reference cell of the toggle MRAM.

(1) Step S01

The X decoder 8 selects the selected read-out word line 24s. The Y decoder 6 selects the reference bit line 21r. The selected reference cell 14rs is therefore selected. The MOS transistor 26 of the selected reference cell 14rs is turned on.

(2) Step S02

The read-out operation (the first sense operation) is executed for the selected reference cell 14rs. That is, the second sense amplifier 3 (the resistance-voltage converter 31) applies a predetermined voltage between the second sense amplifier 3 and the selected reference cell 14rs (ground) so as to cause the reference read-out current Ir to flow in a path from the main reference bit line 28 to the selected reference cell 14rs through the Y decoder 6 and the reference bit line 21r. As a result, the second sense amplifier 3 (the resistance-voltage converter 31) detects a resistance value Rref (1st) of the magnetic tunneling junction element 25r of the selected reference cell 14rs.

(3) Step S03

The second sense amplifier 3 (the storage unit 32) temporarily stores the resistance value Rref (1st).

(4) Step S04

The write operation (the first toggle operation) is executed for the selected reference cell 14rs. The write operation (the toggle operation) is as described in the explanations of FIGS. 4 to 6.

(5) Step S05

The second sense amplifier 3 (the resistance-voltage converter 31) again executes the read-out operation (the second sense operation) for the selected reference cell 14rs. Therefore, the second sense amplifier 3 (the resistance-voltage converter 31) detects a resistance value Rref (2nd) of the magnetic tunneling junction element 25r of the selected reference cell 14rs.

(6) Step S06

The second sense amplifier 3 (determination unit 33) the compares the values of Rref (1st) and Rref (2nd).

(7) Step S07

If it is assumed that a low resistance case is "0" and a high resistance case is "1", a read-out result (a sense result) should be "0" under Rref (1st)<Rref (2nd) (Step S06: yes). That is, original data of the selected reference cell 14rs (before the write operation in Step S04) is "0". However, data of the selected reference cell 14rs is "1" at Step S07.

Next, the second sense amplifier 3 (the determination unit 33) determines whether or not to execute the second toggle operation if reference information to be stored in the reference cell 14r is "0". If the reference information to be stored in the reference cell 14r is "1" (Step S07: no), the operation is ended.

(8) Step S08

If the reference information to be stored in the reference cell 14r is "0" (Step S07: yes), the write operation (the second toggle operation) is executed again for the selected reference cell 14rs. The write operation (the toggle operation) is as described in the explanations of FIGS. 4 to 6. Therefore, data of the selected reference cell 14rs is returned to the original "0".

(9) Step S09

The read-out result (the sense result) is "1" under Rref (1st)>Rref (2nd) (Step S06: no). That is, the original data of the selected reference cell 14rs (before he write operation in Step S04) is "1". However, data of the selected reference cell 14rs is "0" at Step S09.

Next, the second sense amplifier 3 (the determination unit 33) determines whether or not to execute the second toggle operation if the reference information to be stored in the reference cell 14r is "1". If the reference information to be stored in the reference cell 14r is "0" (Step S09: no), the operation is ended.

(10) Step S10

If the reference information to be stored in the reference cell 14r is "1" (Step S09: yes), the write operation (the second toggle operation) is executed again for the selected reference cell 14rs. The write operation (the toggle operation) is as described in the explanations of FIGS. 4 to 6. Therefore, data of the selected reference cell 14rs is returned to the original "1".

The present invention enables to program reference information for the reference cell in the toggle MRAM with high reliability.

A concrete example of the second sense amplifier circuit used for the above-explained read-out (sense) operation and write (program) operation of the reference cell 14r will be explained below.

Figure 10:
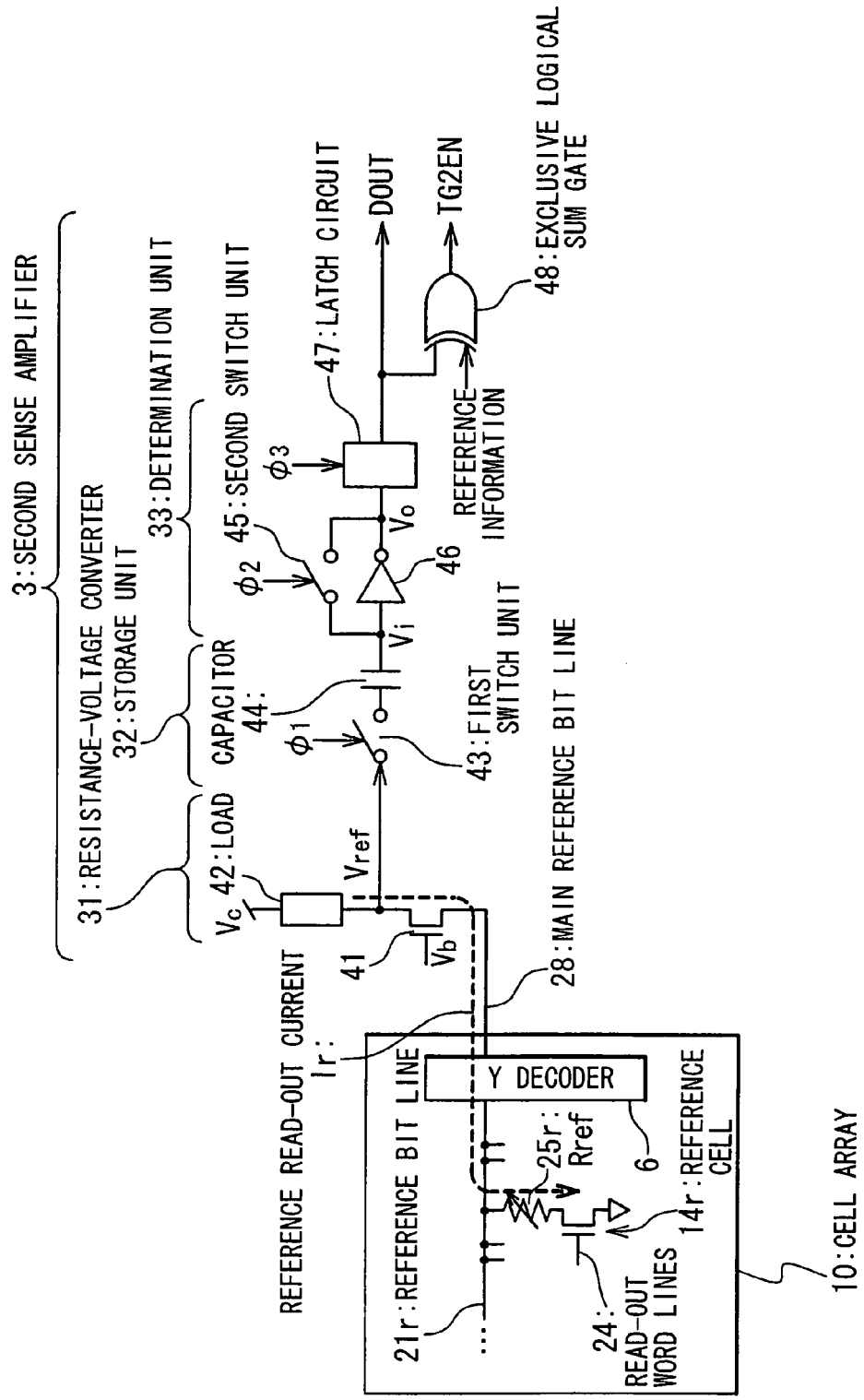
FIG. 10 is a circuit diagram showing a configuration of a second sense amplifier.

FIG. 10 is a circuit diagram showing a configuration of the second sense amplifier. The resistance-voltage converter 31 is composed of a grounded-gate amplifier circuit including a transistor 41 and a load 42. In the transistor 41, a gate receives a bias voltage Vb, a drain is connected to the load 42 and a source is connected to the main reference bit line 28. The bias voltage Vb functions to prevent a voltage equal to or larger than a breakdown voltage of the MTJ (the magnetic tunneling junction element 25r) from being applied to a source of the transistor 41, that is, the main reference bit line 28. One of terminals of the load 42 is connected to a voltage source VC and the other terminal of the load 42 is connected to the drain of the transistor 41. A constant voltage VC is divided by the resistance value Rref of the magnetic tunneling junction element 25r of the reference cell 14r and the load 42 at the first read-out operation (the sense operation) so as to provide a voltage Vref (=k·Rref) which is proportional to the resistance value Rref. The Vref is a voltage on a drain side of the transistor 41. That is, here, the operation is executed by causing the Rref in the flowchart of FIG. 9 to correspond to the Vref.

The storage unit 32 includes a first switch unit 43 and a capacitor 44. One of terminals of the first switch unit 43 is connected to the drain of the transistor 41 and the other terminal of the first switch unit 43 is connected to one of terminals of the capacitor 44. On/off timing of the first switch unit 43 is controlled by a control signal φ1. One of the terminals of the capacitor 44 is connected to the other terminal of the first switch unit 43, and the other terminal of the capacitor 44 is connected to a terminal on an input side of an inverter 46. An electrical charge corresponding to Vref which is supplied to the first switch unit 43 in the first read-out operation (the sense operation) is accumulated in the capacitor 44 so as to store the Vref.

The determination unit 33 includes a second switch unit 45, the inverter 46, a latch circuit 47 and an exclusive logical sum gate 48. One of terminals of the second switch unit 45 is connected to a terminal on an input side of the inverter 46, and the other terminal of the second switch unit 45 is connected to a terminal on an output side of the inverter 46. On/off timing of the second switch unit 45 is controlled by a control signal φ2. The terminal on the input side of the inverter 46 is connected to the other terminal of the capacitor 44, and the terminal on the output side of the inverter 46 is connected to a terminal on an input side of the latch circuit 47. The terminal on the input side of the latch circuit 47 is connected to the terminal on the output side of the inverter 46, and a terminal on an output side of the latch circuit 47 outputs an output signal DOUT and is connected to one of terminals on an input side of the exclusive logical sum gate. Timing of the data output is controlled by a control signal φ3. One of terminals on the input side of the exclusive logical sum gate 48 is connected to the terminal on the output side of the latch circuit 47, and the other terminal on the input side of the exclusive logical sum gate 48 is connected to a signal line for providing reference information to be programmed (to be stored) in the reference cell 14r. The exclusive logical sum gate 48 provides TG2EN which is an enable signal of the second toggle operation as a determination signal.

Figure 11:
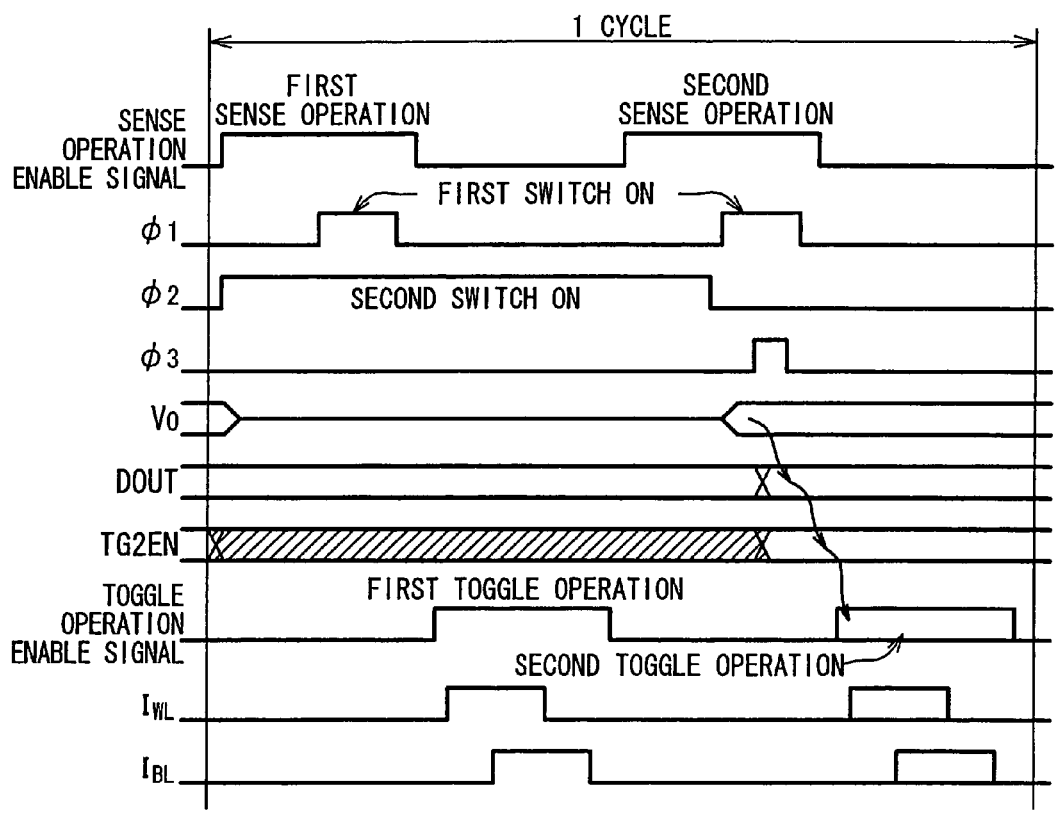
FIG. 11 is a timing chart corresponding to the flowchart in FIG. 9.

FIG. 11 shows a timing chart corresponding to a flowchart of an operation of the first embodiment in FIG. 9. Here, in the operation, the Vref corresponds to the Rref in the flow of the FIG. 9.

After the selected reference cell 14*rs* is selected (Step S01), the control signal φ2 is brought into a high level and the second switch 45 is brought into an ON state in the first sense operation (Step S02). At this time, an input voltage Vi and an output voltage V0 of the inverter 46 are equal to each other. Then, the control signal φ1 is brought into a high level and the first switch 43 is brought into an ON state. At this time, voltages of both terminals of the capacitor 44 are made to be Vref (1st)–Vi. The first sense operation is ended, the control signal φ1 is brought into a low level, and the first switch 43 is brought into an OFF state. The voltage of both terminals of the capacitor 44 is thus stored (Step S03).

After the first toggle operation (Step S04), the second sense operation starts. At this time, the resistance-voltage converter 31 provides the voltage Vref (2nd) (Step S05). When the first switch 43 is brought into an ON state (control signal φ1: high level) after the second switch 45 is brought into an OFF state (control signal φ2: low level), Vi is shifted by dV=Vref (1st)–Vref (2nd) due to a coupling effect of the capacitor 44 (Step S06). For example, if an initial state is toggled from "0" to "1" in the first toggle operation in Step S04, Vref (1st)<Vref (2nd) is true (Step S06: yes). Accordingly, an output signal of the inverter 46 is brought into "0" level. On the contrary, if an initial state is toggled from "1" to "0", Vref (1st)>Vref (2nd) is true (Step S06: no). Accordingly, an output signal of the inverter 46 is brought into "1" level. An output signal of the inverter 46 is latched by the latch circuit 47 at a rising edge of the control signal φ3, and a sense result DOUT (data initially stored in the selected reference cell 14*rs*) is outputted.

If the reference signal (to be stored) is equal to the sense result DOUT (Step S07: yes, Step S09: yes), the signal TG2EN is activated by the exclusive logical sum gate 48 which executes the second toggle operation. The second toggle operation is therefore executed (Step S08 and Step S10). If the reference signal and the sense result DOUT are different from each other, the signal TG2EN is inactivated.

Figure 12:
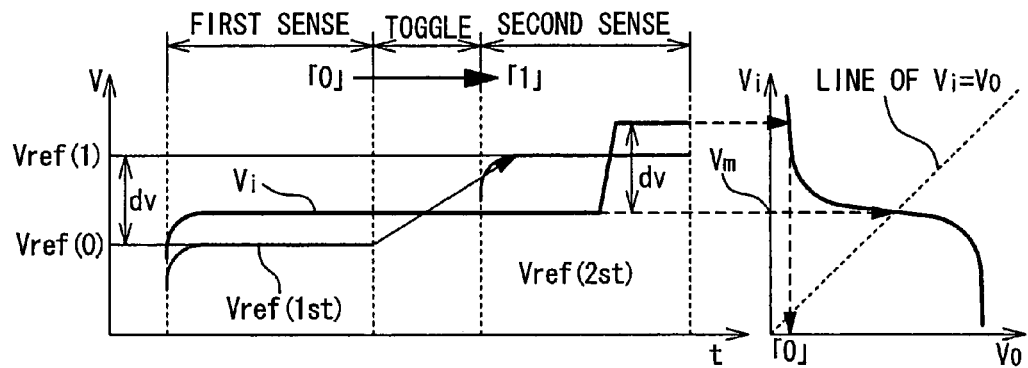
FIG. 12 is a graph showing a relationship among Vref, Vi and V0 in the operation in FIG. 9 (initial state of "0")
Figure 13:
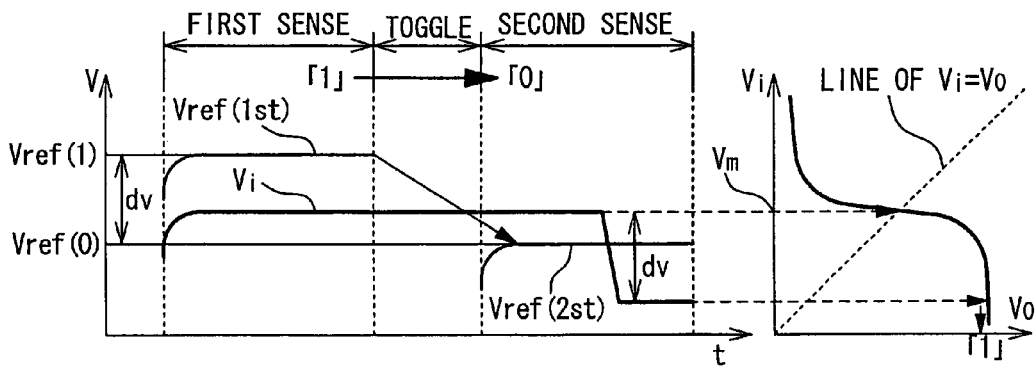
FIG. 13 is graph showing a relationship among Vref, Vi and V0 in the operation in FIG. 9 (initial state of "1")

FIGS. 12 and 13 are graphs showing a relationship among Vref, Vi and V0 in the operation of the first embodiment in FIG. 9. A left side view indicates a time-varying relationship between Vref and Vi, in which a vertical axis indicates a voltage and a horizontal axis indicates a time (elapse). A right side view indicates a relationship between Vi and V0 (characteristics of the inverter 46), in which a vertical axis indicates Vi and a horizontal axis indicates V0. FIG. 12 shows a case that an initial state (initially stored data) of the selected reference cell 14*rs* is "0", and FIG. 13 shows a case that an initial state of the selected reference cell 14*rs* is "1".

As shown in the left side view of FIG. 12, Vref (1st)="0" (Steps S01 to S03) is brought into Vref (2nd)="1" by the toggle operation (Step S04), in which a voltage is changed only by dV=Vref (1st)–Vref (2nd)>0 (increased only by dV) (Step S05). Accordingly, a voltage of Vi is changed only by the same dV>0. As a result, the inverter 46 outputs a low level V0 (="0") as shown in the right view (Step S06).

As shown in the left side view of FIG. 13, Vref (1st)="1" (Steps S01 to S03) is brought into Vref (2nd)="0" by the toggle operation (Step S04), in which a voltage is changed only by dV=Vref (1st)–Vref (2nd)<0 (reduced only by |dV|) (Step S05). Accordingly, a voltage of Vi is changed only by the same dV<0. As a result, the inverter 46 outputs a high level V0 (="1") as shown in the right view (Step S06).

It is made possible to program reference information for the reference cell in the toggle MRAM with high reliability by thus using the second sense amplifier 3.

Figure 14:
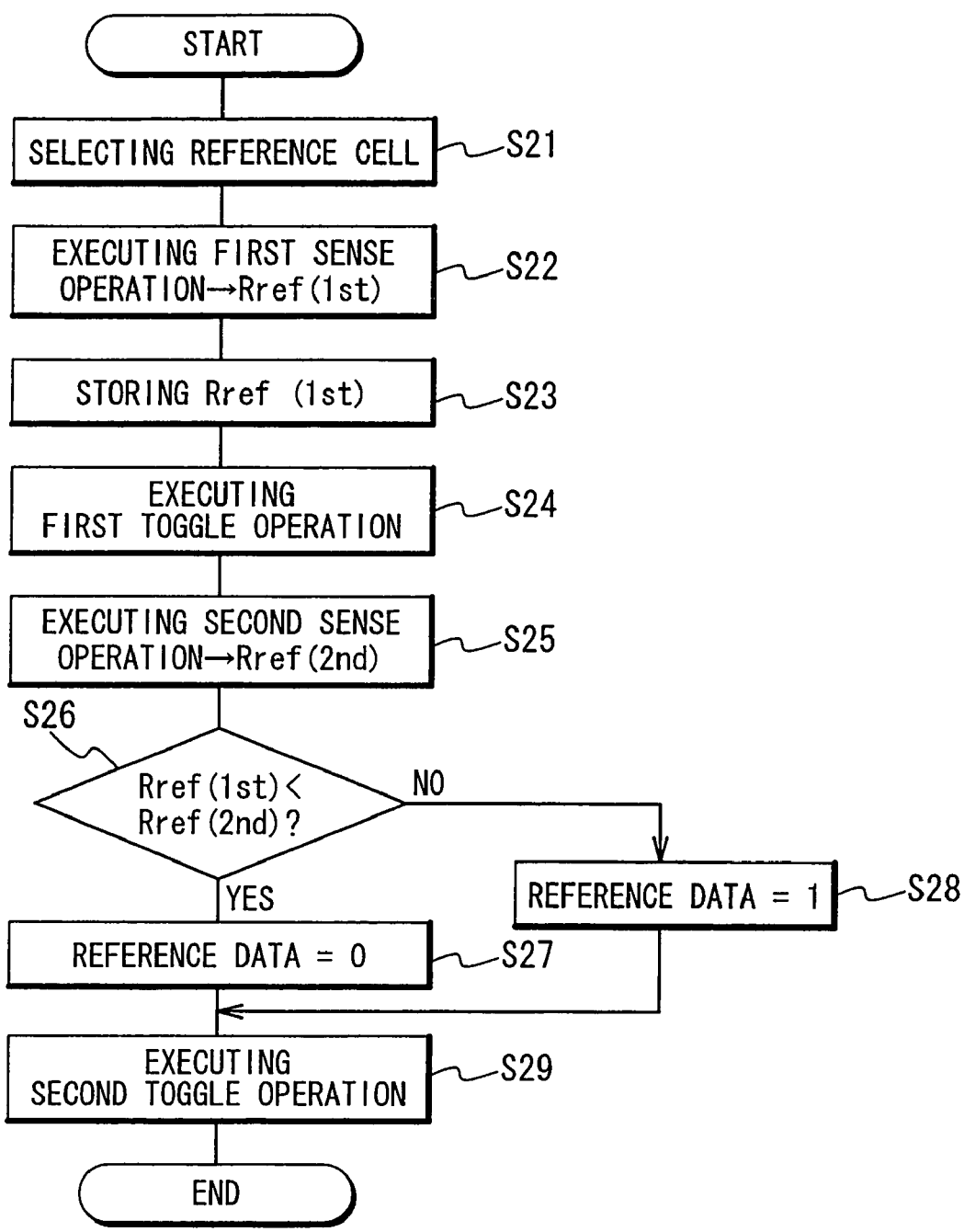
FIG. 14 is a flowchart showing a read-out operation of the first embodiment of the toggle MRAM according to the present invention.

FIG. 14 is a flowchart showing an operation of the first embodiment of the toggle MRAM according to the present invention. FIG. 14 indicates a sense method (a read-out method) of the reference cell of the toggle MRAM.

(1) Step S21

The X decoder 8 selects the selected read-out word line 24*s*. The Y decoder 6 selects the reference bit line 21*r*. The selected reference cell 14*rs* is therefore selected. The MOS transistor 26 of the selected reference cell 14*rs* is turned on.

(2) Step S22

The read-out operation (the first sense operation) is executed for the selected reference cell 14*rs*. That is, the predetermined voltage is applied between the second sense amplifier 3 and the selected reference cell 14*rs* (ground) by the second sense amplifier 3 (the resistance-voltage converter 31) so as to cause the reference read-out current Ir to flow in the path from the main reference bit line 28 to the selected reference cell 14*rs* through the Y decoder 6 and the reference bit line 21*r*. As a result, the second sense amplifier 3 (the resistance-voltage converter 31) detects the resistance value Rref (1st) of the magnetic tunneling junction element 25*r* of the selected reference cell 14*rs*.

(3) Step S23

The second sense amplifier 3 (the storage unit 32) temporarily stores the resistance value Rref (1st).

(4) Step S24

The write operation (the first toggle operation) is executed for the selected reference cell 14*rs*. The write operation (the toggle operation) is as described in the explanations of FIGS. 4 to 6.

(5) Step S25

The second sense amplifier 3 (the resistance-voltage converter 31) again executes the read-out operation (the second sense operation) for the selected reference cell 14*rs*. Therefore, the second sense amplifier 3 (the resistance-voltage converter 31) detects the resistance value Rref (2nd) of the magnetic tunneling junction element 25*r* of the selected reference cell 14*rs*.

(6) Step S26

The second sense amplifier 3 (the determination unit 33) compares the value of Rref (1st) and Rref (2nd).

(7) Step S27

If it is assumed that a low resistance case is "0" and a high resistance case as "1", the read-out result (the sense result) should be "0" under Rref (1st)<Rref (2nd) (Step S26: yes). That is, the original data of the selected reference cell 14*rs* (before the write operation in Step S24) can be read out as "0". However, data of the selected reference cell 14*rs* is "1" at Step S27.

(8) Step S28

The read-out result (the sense result) should be "1" under Rref (1st)>Rref (2nd) (Step S26: no). That is, the original data of the selected reference cell 14*rs* (before the write operation in Step S24) can be read out as "1". However, data of the selected reference cell 14*rs* is "0" at Step S28.

(9) Step S29

A write operation (the second toggle operation) is executed again for the selected reference cell 14*rs*. The write operation (the toggle operation) is as described in the explanations of FIGS. 4 to 6. Therefore, data of the selected reference cell 14rs is returned to the original data.

In the second sense amplifier as shown in FIG. 10, it is possible to use the sense result DOUT of the latch circuit 47 as a read-out data in Step S27 or Step S28 in a case of the read-out operation in FIG. 14. That is, it is possible to read out data of a reference cell in the toggle MRAM by using the second sense amplifier 3 mentioned above without comparing with data of other cells.

Second Embodiment

A second embodiment of the toggle MRAM according to the present invention will be explained next with reference to the attached drawings.

A configuration of the second embodiment of the toggle MKAM of the present invention will be explained first referring to the attached drawings.

Figure 15:
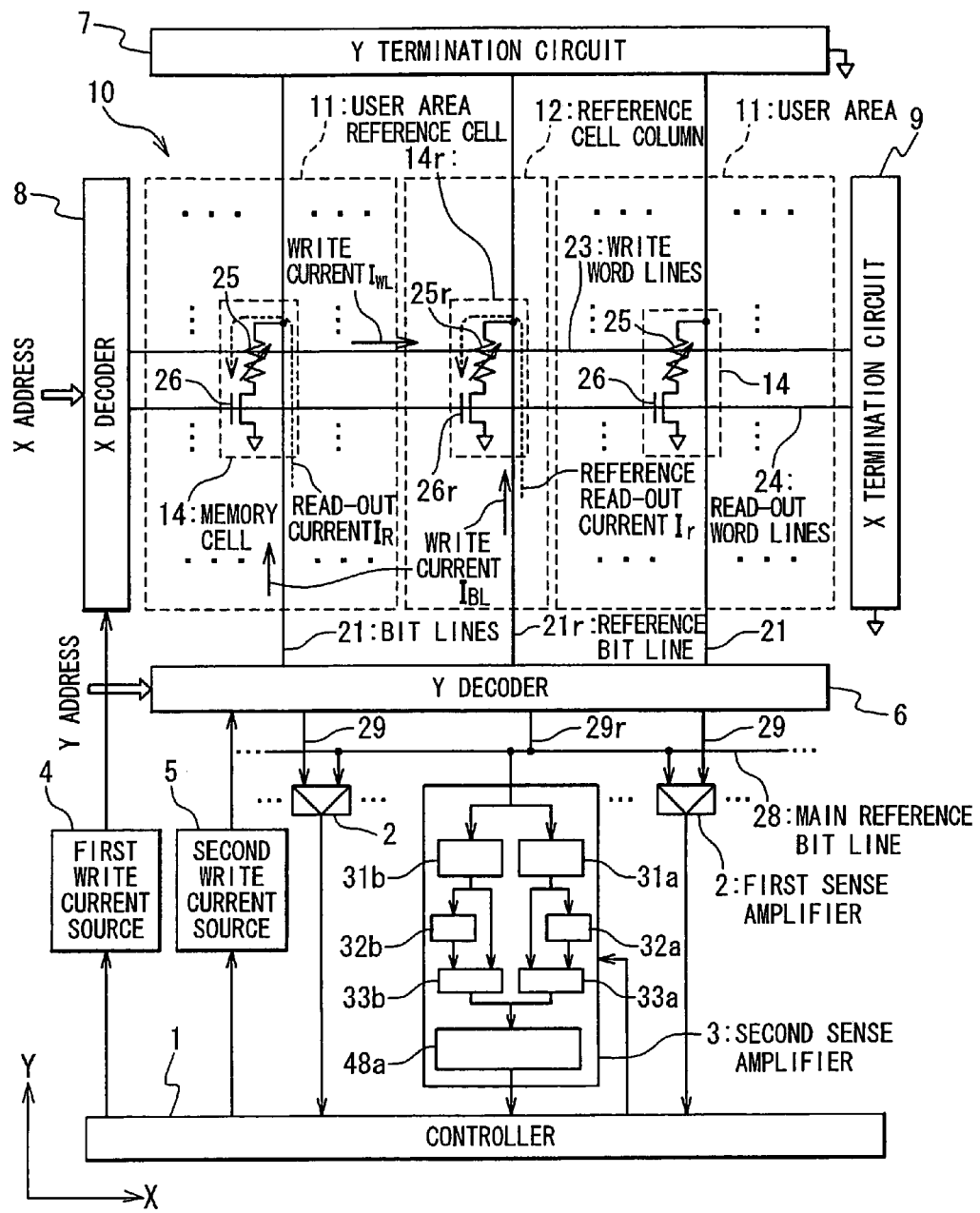
FIG. 15 is a block diagram showing a configuration of a second embodiment of the toggle MRAM according to the present invention.

FIG. 15 is a block diagram showing a configuration of the second embodiment of the toggle MRAM according to the present invention. This configuration of the second embodiment of the toggle MRAM according to the present invention is similar to that of FIG. 8. However, a configuration of the second sense amplifier 3 and a method for programming the reference cell in the present embodiment is different from those of the first embodiment. A circuit for detecting the toggle operation is provided to monitor whether or not the toggle operation has been executed for the reference cell 14r, and a write current value will be increased if the toggle operation has not been executed. It is therefore possible to program the reference cell with higher reliability.

The second sense amplifier 3 includes a first resistance-voltage converter 31a, a first storage unit 32a, a first determination unit 33a, a second resistance-voltage converter 31b, a second storage unit 32b, a second determination unit 33b and a determination circuit 48a. The first and second resistance-voltage converters 31a and 31b detect a resistance value (a current value) of the magnetic tunneling junction element 25r of the reference cell 14r, convert it to a voltage, and add a predetermined positive offset voltage and a negative offset voltage. The first and second storage units 32a and 32b temporarily hold an output voltage of the corresponding resistance-voltage converter 31 (31a and 31b). The first and second determination units 33a and 33b compares a present output voltage of the corresponding resistance-voltage converter 31 with an output voltage of the corresponding storage unit 32 (32a and 32b) (a previous output voltage of the resistance-voltage converter 31). The determination circuit 48a determines information to be stored in the reference cell 14r on the basis of the comparison result.

Other configurations of the second embodiment are the same as those of the first embodiment, thereby explanations thereof will be omitted. The general read-out operation and the write operation of the memory cell 14 are similar to those of the conventional toggle MRAM (similar to the explanations of FIGS. 4 to 6), thereby the explanations thereof will be omitted.

An operation of the second embodiment of the toggle MRAM according to the present invention will be explained referring to the attached drawings.

Figure 16:
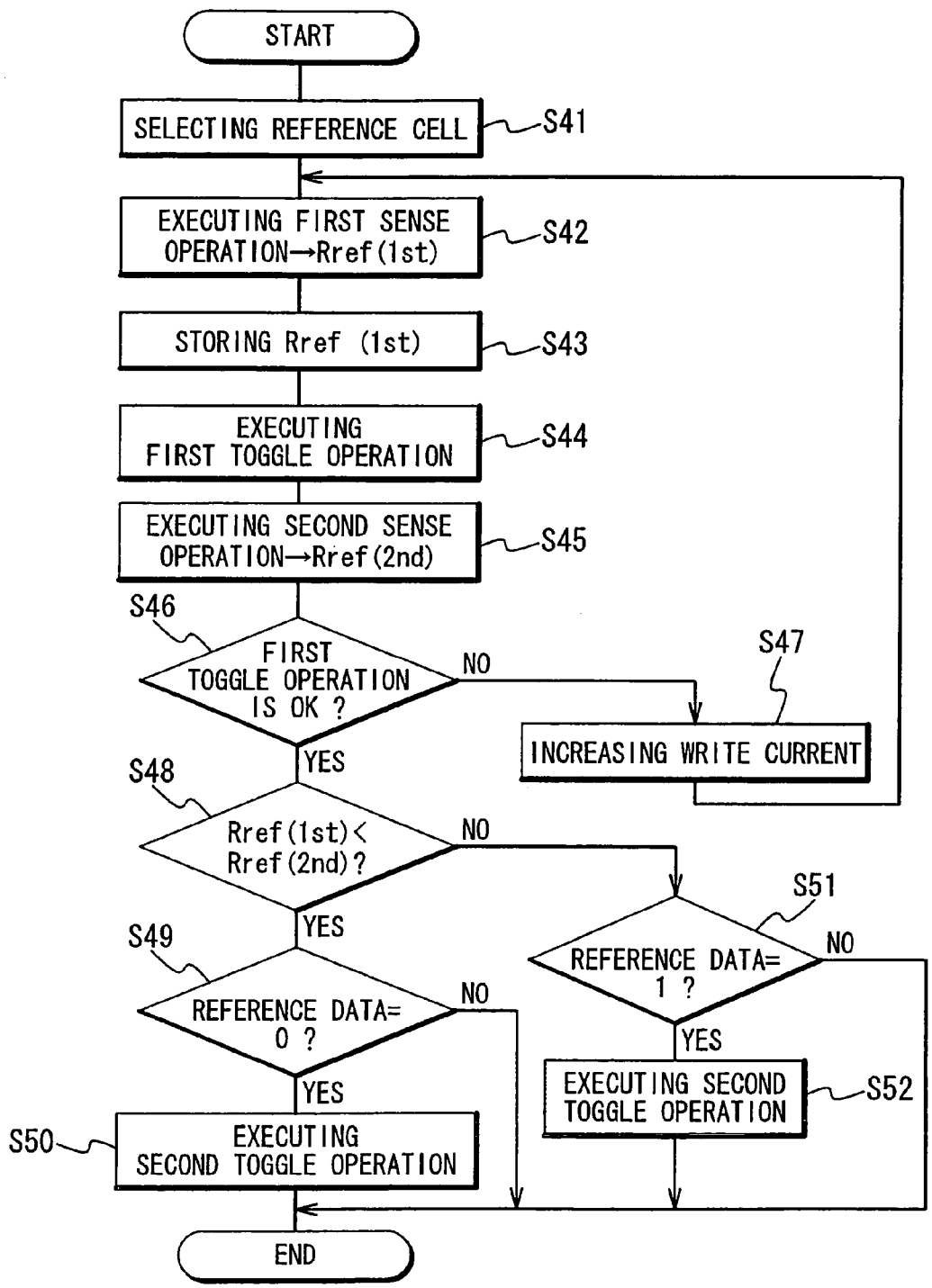
FIG. 16 is a flowchart showing a write operation of the second embodiment of the toggle MRAM according to the present invention.

FIG. 16 is a flowchart showing an operation of the second embodiment of the toggle MRAM of the present invention. FIG. 16 indicates a program method (a write method) of the reference cell of the toggle MRAM.

(1) Step S41
The X decoder 8 selects the selected read-out word line 24s. The Y decoder 6 selects the reference bit line 21r. The selected reference cell 14rs is therefore selected. The MOS transistor 26 of the selected reference cell 14rs is turned on.

(2) Step S42
The read-out operation (the first sense operation) is executed for the selected reference cell 14rs. That is, the second sense amplifier 3 (the first and second resistance-voltage converters 31a and 31b) applies a predetermined voltage between the second sense amplifier 3 and the selected reference cell 14rs (ground) to cause the reference read-out current Ir to flow in the path from the main reference bit line 28 to the selected reference cell 14rs through the Y decoder 6 and the reference bit line 21r. As a result, the first and second resistance-voltage converters 31a and 31b of the second sense amplifier 3 detect resistance values Rref1 (1st) and Rref2 (1st) of the magnetic tunneling junction element 25r of the selected reference cell 14rs, respectively.

(3) Step S43
The first and second storage units 32a and 32b of the second sense amplifier 3 temporarily store the resistance values Rref1 (1st) and Rref2 (1st), respectively.

(4) Step S44
The write operation (the first toggle operation) is executed for the selected reference cell 14rs. The write operation (the toggle operation) is as described in the explanations of FIGS. 4 to 6.

(5) Step S45
The first and second resistance-voltage converters 31a and 31b of the second sense amplifier 3 again execute the read-out operation (the second sense operation) for the selected reference cell 14rs. Therefore, the first and second resistance-voltage converters 31a and 31b of the second sense amplifier 3 detect resistance values Rref1 (2nd) and Rref2 (2nd) of the magnetic tunneling junction element 25r of the selected reference cell 14rs, respectively.

(6) Step S46
The first determination unit 33a of the second sense amplifier 3 outputs a signal Q1 which indicates a magnitude relation between the resistance values Rref1 (1st) and Rref1 (2nd). The second determination unit 33b outputs a signal Q2 which indicates a magnitude relation between the resistance values Rref2 (1st) and Rref2 (2nd). The determination circuit 48a determines whether or not the signal Q1 is consistent with the signal Q2. If the signal Q1 is consistent with the signal Q2 (Step S46: yes), the first toggle operation is meant to be normally executed, thereby the process goes on to Step S48. If the signal Q1 is not consistent with the signal Q2 (Step S46: no), the first toggle operation is not normally executed, thereby the process goes on to Step S47.

(7) Step S47
Because the first toggle operation is not normally executed, the write current $I_{WL}$ and the write current $I_{BL}$ are increased by a predetermined amount so as to start from Step S42 again.

(8) Step S48
The determination circuit 48a of the second sense amplifier 3 obtains the magnitude relation between the Rref (1st) and the Rref (2nd) (=the magnitude relation between the Rref1 (1st) and the Rref1 (2nd)=the magnitude relation between the Rref2 (1st) and the Rref2 (2nd)). That is, the signal Q1 and the signal Q2 that are equal to each other are determined to be "0" or "1".

(9) Step S49

If it is assumed that a low resistance case is "0" and a high resistance case is "1", the read-out result (the sense result) should be "n" under Rref (1st)<Rref (2nd) (Step S48: yes). That is, the original data of the selected reference cell 14rs (before the write operation in Step S44) is "0". However, data of the selected reference cell 14rs is "1" at Step 549.

Next, the determination circuit 48a of the second sense amplifier 3 determines whether or not to execute the second toggle operation if the reference information to be stored in the reference cell 14r is "0". If the reference information to be stored in the reference cell 14r is "1" (Step S49: no), the operation is ended.

(10) Step S50

If the reference information to be stored in the reference cell 14r is "0" (Step S49: yes), the write operation (the second toggle operation) is executed again for the selected reference cell 14rs. The write operation (the toggle operation) is as described in the explanations of FIGS. 4 to 6. Data of the selected reference cell 14rs is thus returned to the original "0".

(11) Step S51

The read-out result (the sense result) should be "1" under Rref (1st)>Rref (2nd) (Step S48: no). That is, the original data of the selected reference cell 14rs (before the write operation in Step S44) is "1". However, the data of the selected reference cell 14rs is "0" at Step S51.

Next, the determination circuit 48a of the second sense amplifier 3 determines whether or not to execute the second toggle operation if the reference information to be stored in the reference cell 14r is "1". If the reference information to be stored in the reference cell 14r is "0" (Step S51: no), the operation is ended.

(12) Step S52

If the reference information to be stored in the reference cell 14r is "1" (Step S51: yes), the write operation (the second toggle operation) is again executed for the selected reference cell 14rs. The write operation (the toggle operation) is as described in the explanations of FIGS. 4 to 6. Data of the selected reference cell 14rs is thus returned to the original "1".

The present invention makes it possible to program the reference information in the reference cell in the toggle MRAM with high reliability.

A concrete example of the second sense amplifier circuit used for the above-explained read-out (sense) operation and write (program) operation of the reference cell 14r will be explained below.

Figure 17:
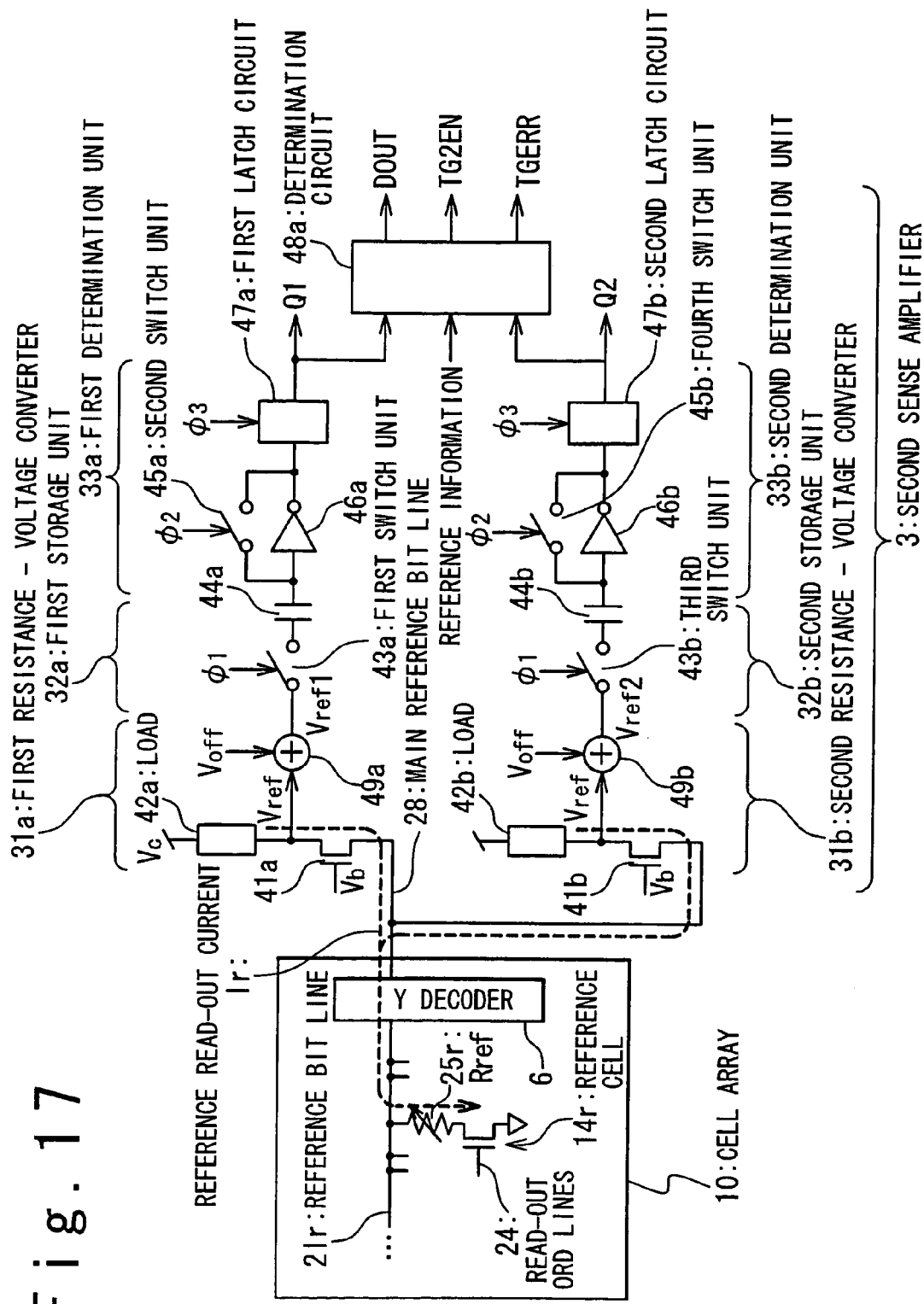
FIG. 17 is a circuit diagram showing a configuration of the second sense amplifier.

FIG. 17 is a circuit diagram showing a configuration of the second sense amplifier. The first resistance-voltage converter 31a is composed of a grounded-gate amplifier circuit including a transistor 41a, a load 42a and an adding unit 49a. In the transistor 41a, a gate receives the bias voltage Vb, a drain is connected to the load 42a and a source is connected to the main reference bit line 28. The bias voltage Vb functions so as not to apply the voltage equal to or larger than the breakdown voltage of the MTJ (magnetic tunneling junction element 25r) to the source of the transistor 41a, that is, the main reference bit line 28. One of terminals of the load 42a is connected to the voltage source VC and the other terminal thereof is connected to the drain of the transistor 41a. The adding unit 49a is connected to a drain, a wiring supplying a positive offset voltage Voff and a first switch unit 43a. The constant voltage VC is divided by the resistance value Rref of the magnetic tunneling junction element 25r of the reference cell 14r and the load 42a in the first read-out operation (the sense operation) so as to provide Vref1=k·Rref+Voff which is obtained by adding the offset voltage Voff to the voltage Vref (=k·Rref) proportional to the resistance value Rref. The Vref is a voltage on a drain side of the transistor 41a.

The first storage unit 32a includes a first switch unit 43a and a capacitor 44a. One of terminals of the first switch unit 43a is connected to the adding unit 49a and the other terminal thereof is connected to one of terminals of capacitor 44a. One/off timing of the first switch unit 43a is controlled by a control signal φ1. One of terminals of the capacitor 44a is connected to the other terminal of the first switch unit 43a, and the other terminal thereof is connected to a terminal on an input side of an inverter 46a. An electrical charge corresponding to Vref1 which is supplied to the first switch unit 43a in the first read-out operation (the sense operation) is accumulated in the capacitor 44a so as to store the Vref.

The first determination unit 33a includes a second switch unit 45a, an inverter 46a and a latch circuit 47a. One of terminals of the second switch unit 45a is connected to the terminal on the input side of the inverter 46a and the other terminal thereof is connected to a terminal on an output side of the inverter 46a. On/off timing of the second switch unit 45a is controlled by the control signal φ2. The terminal on the input side of the inverter 46a is connected to the other terminal of the capacitor 44a and the terminal on the output side thereof is connected a terminal on an input side of the latch circuit 47a. The terminal on the input side of the latch circuit 47a is connected to the terminal on the output side of the inverter 46a, and a terminal on an output side outputs an output signal Q1 and is connected to one of terminals on an input side of a determination circuit 48a. A data output timing of the latch circuit 47a is controlled by control signal φ3.

The second resistance-voltage converter 31b is composed of a grounded-gate amplifier circuit including a transistor 41b, a load 42b and an adding unit 49b. In the transistor 41b, a gate receives the bias voltage Vb, a drain is connected to the load 42b and a source is connected to the main reference bit line 28. The bias voltage Vb functions so as not to apply the voltage equal to or larger than the breakdown voltage of the MTJ (magnetic tunneling junction element 25r) to the source of the transistor 41b, that is, the main reference bit line 28. One of terminals of the load 42b is connected to the voltage source VC and the other terminal thereof is connected to the drain of the transistor 41b. The adding unit 49b is connected to a drain, a wiring supplying a negative offset voltage −Voff and the third switch unit 43b. The constant voltage VC is divided by the resistance value Rref of the magnetic tunneling junction element 25r of the reference cell 14r and the load 42b in the first read-out operation (the sense operation) so as to provide Vref2=k·Rref−Voff by adding an offset voltage −Voff to a voltage Vref(=k·Rref) proportional to the resistance value Rref. The Vref is a voltage on a drain side of the transistor 41b.

The second storage unit 32b includes a third switch unit 43b and a capacitor 44b. One of terminals of the third switch unit 43b is connected to the adding unit 49b and the other terminal thereof is connected to one of terminals of capacitor 44b. One/off timing of the third switch unit 43b is controlled by the control signal φ1. One of terminals of the capacitor 44b is connected to the other terminal of the third switch unit 43b, and the other terminal thereof is connected to a terminal on an input side of an inverter 46b. An electrical charge corresponding to Vref2 which is supplied to the third switch unit 43b in the first read-out operation (the sense operation) is accumulated in the capacitor 44b so as to store the Vref2.

The second determination unit 33b includes a fourth switch unit 45b, the inverter 46b and a latch circuit 47b. One of terminals of the fourth switch unit 45b is connected to the terminal on the input side of the inverter 46b and the other terminal thereof is connected to a terminal on an output side of the inverter 46b. On/off timing of the fourth switch unit 45b is controlled by the control signal φ2. The terminal on the input side of the inverter 46b is connected to the other terminal of the capacitor 44b and the terminal on the output side thereof is connected a terminal on an input side of the latch circuit 47b. The terminal on the input side of the latch circuit 47b is connected to the terminal on the output side of the inverter 46b and a terminal on an output side outputs an output signal Q2 and is connected to one of terminals on an input side of a determination circuit 48a. A data output timing of the latch circuit 47b is controlled by the control signal φ3.

The determination circuit 48a is common to the first determination unit 33a and the second determination unit 33b, in which a first terminal on an input side thereof is connected to the terminal on the output side of the latch circuit 47a, a second terminal on the input side thereof is connected to the terminal on the output side of the latch circuit 47b, and a third terminal on the input side thereof is connected to a signal line for providing the reference information to be programmed (to be stored) for the reference cell 14r. The determination circuit 48a determines whether or not the first toggle operation has been executed and also determines whether or not the second toggle operation should be executed so as to provide, as a determination result, an output signal DOUT, a second toggle enable signal TG2EN, and a toggle error signal TGERR.

A relationship between FIG. 16 and FIG. 17 will be explained next.

The selected reference cell 14rs is selected (Step S41).

Thereafter, the control signal φ1 is brought into a high level and the first switch 43a is brought into an ON state in the first sense operation. At this time, the first resistance-voltage converter 31a outputs the voltage Vref1 (1st)=k·Rref+Voff by adding the offset voltage Voff to a voltage proportional to a resistance value of the reference cell. In this case, it is assumed that the Voff is smaller than a voltage difference between Vref in a state of "0" and Vref in a state of "1". A voltage between both terminals of the capacitor 44a is made to be the Vref1 (1st).

Meanwhile, the control signal φ1 is brought into a high level and the third switch 43b is brought into an ON state. At this time, the first resistance-voltage converter 31b outputs the voltage Vref2 (1st)=k·Rref−Voff by adding the offset voltage−Voff to the voltage proportional to the resistance value of the reference cell. A voltage between both terminals of the capacitor 44b is made to be the Vref2 (1st) (Step S42).

The first sense operation is ended, the control signal φ1 is brought into a low level, and the first switch 43a and the third switch 43b are brought into an OFF state. The voltages between both terminals of the capacitor 44a and the capacitor 44b are therefore retained (Step S43).

The first toggle operation is executed (Step S44).

Next, in the second sense operation, the first resistance-voltage converter 31a and the second resistance-voltage converter 31b output a voltage Vref1 (2nd)=Vref2 (2nd)=k·Rref in which the Voff is not added or reduced, respectively (Step S45).

If the first switch 43a is brought into an ON state (the control signal φ1: high level) after bringing the second switch 45a into an OFF state (the control signal φ2: low level), the Vref1 (1st) is shifted to the Vref1 (2nd) due to a coupling effect of the capacitor 44a.

Similarly, if the third switch 43b is brought into an ON state (the control signal φ1: high level) after bringing the fourth switch 45b into an OFF state (the control signal φ2: low level), the Vref2 (1st) is shifted to the Vref2 (2nd) due to a coupling effect of the capacitor 44b.

The above situation will be further explained.

Figure 19:
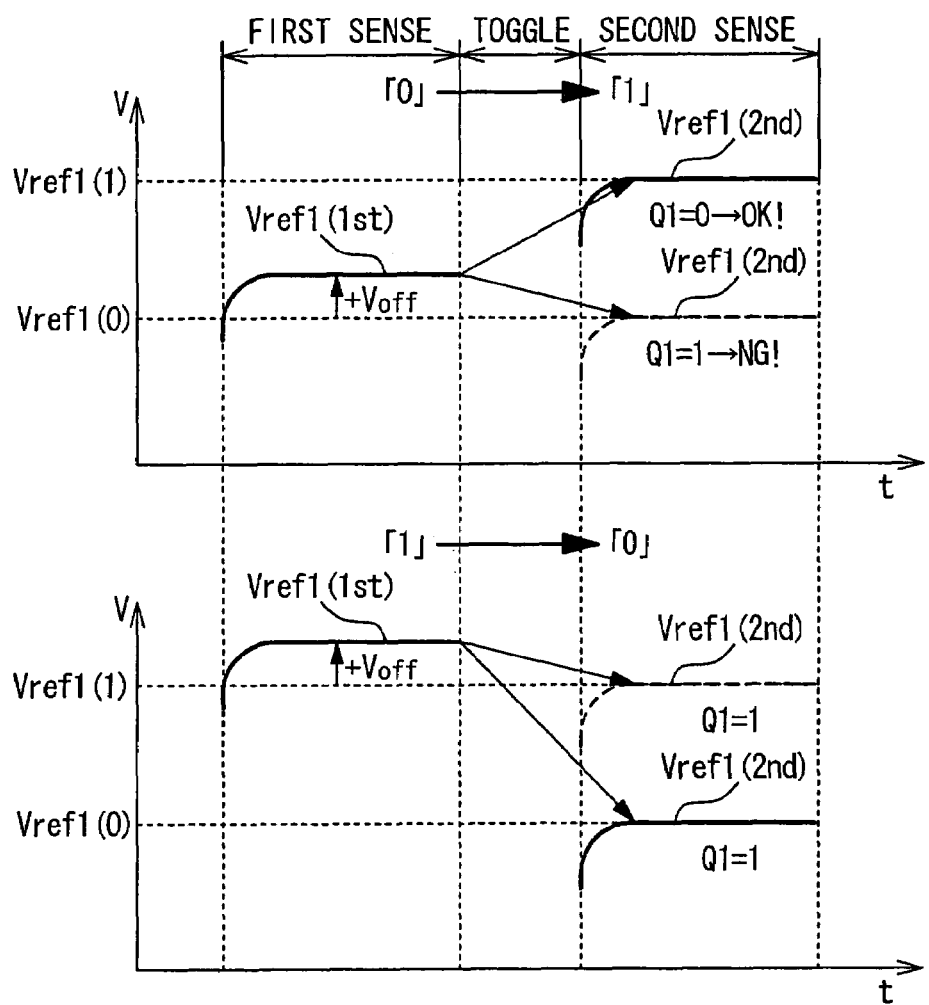
FIG. 19 is a graph showing a relationship between Vref1 (1st) and Vref1 (2nd) in the operation in FIG. 17.

FIG. 19 is a graph showing a relationship between the Vref1 (1st) and the Vref1 (2nd) in the operation of the second embodiment in FIG. 16. A vertical axis indicates a voltage and a horizontal axis indicates a time (elapse). A graph on an upper side indicates a case of an initial state as "0", and a graph on a lower side indicates a case of an initial state as "1".

In the case of the initial state as "0" (upper side of FIG. 19), in first sense step, Vref (1st) =k·Rref+Voff. In the second sense step, if the toggle operation is successful, since the state is toggled to "1" by the first toggle operation in Step S44, Vref1 (1st) and Vref1 (2nd) are supposed to be Vref1 (1st)<Vref1 (2nd). In this case, the output signal Q1 of the first latch circuit 47a should be "0" (similar to FIG. 12). However, if the toggle operation is failed, Vref1 (1st) and Vref1 (2nd) are supposed to be Vref1 (1st)>Vref1 (2nd), oppositely. In this case, the output signal Q1 of the first latch circuit 47a should be "1" (similar to FIG. 13).

Circumstances will be different though in a case of an initial state as "1" (lower side of FIG. 19) If the toggle operation is successful, since the state is toggled to "0" by the first toggle operation in Step S44, Vref1 (1st) and Vref1 (2nd) are supposed to be Vref1 (1st)>Vref1 (2nd). In this case, the output signal Q1 of the first latch circuit 47a should be "1" (similar to FIG. 13). In addition, even though the toggle operation is failed, Vref1 (1st) and Vref1 (2nd) are supposed to be Vref1 (1st)>Vref1 (2nd). In this case, the output signal Q1 of the first latch circuit 47a should be "1" (similar to FIG. 13).

Figure 20:
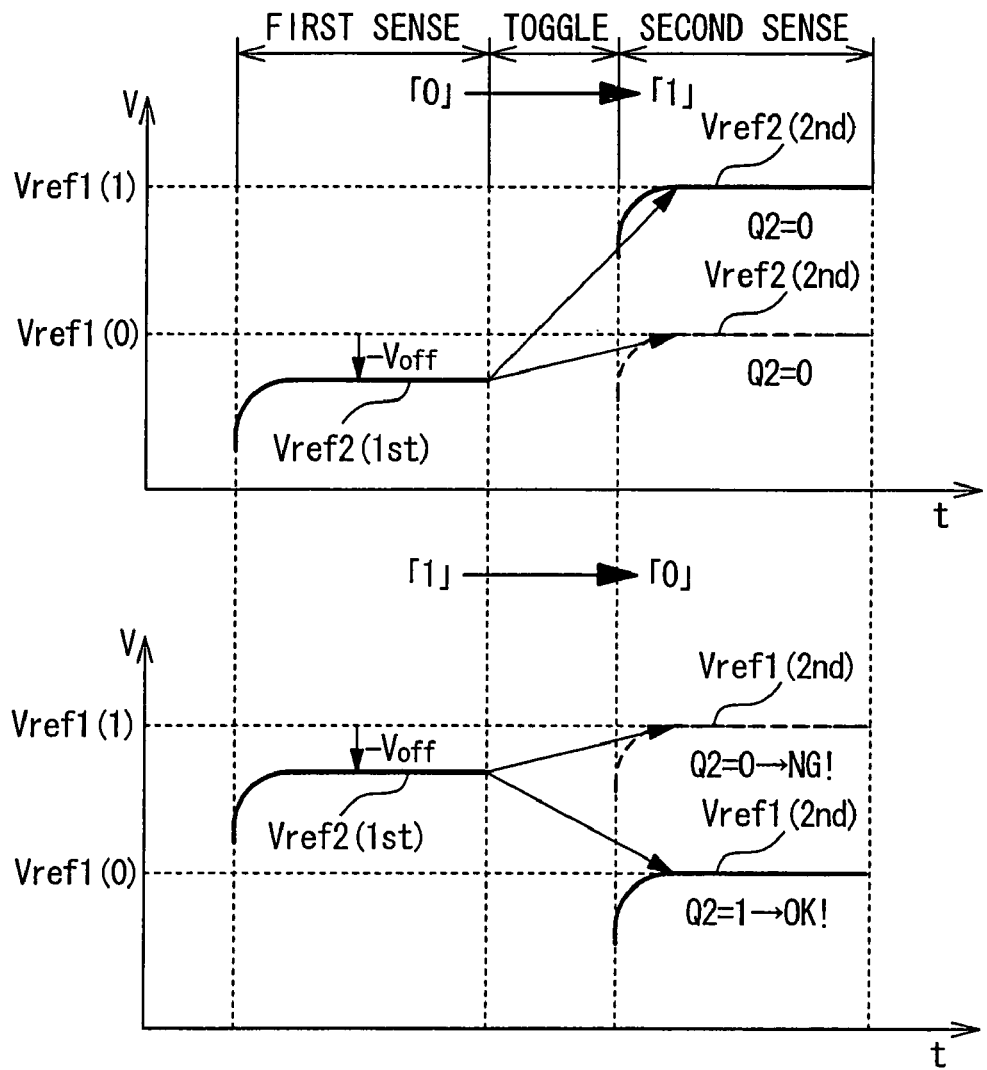
FIG. 20 is a graph showing a relationship between Vref2 (1st) and Vref2 (2nd) in the operation in FIG. 17.

FIG. 20 is a graph showing a relationship between the Vref2 (1st) and Vref2 (2nd) in the operation of the second embodiment in FIG. 16. A vertical axis indicates a voltage, and a horizontal axis indicates a time (elapse). An upper side of FIG. 20 indicates an initial state as "0", and a lower side of FIG. 20 indicates an initial state as "1".

In the case of the initial state as "1" (lower side of FIG. 20), in the first sense phase, Vref2 (1st)=k·Rref−Voff. If the toggle operation is successful in the second sense step, since the state is toggled to "0" in the first toggle operation in Step S44, Vref2 (1st) and Vref2 (2nd) are supposed to be Vref2 (1st)>Vref2 (2nd). In this case, the output signal Q2 of the first latch circuit 47b should be "1" (similar to FIG. 13). However, if the toggle operation is failed, Vref2 (1st) and Vref2 (2nd) are supposed to be Vref2 (1st)<Vref2 (2nd). In this case, an output from the output signal Q2 of the first latch circuit 47b should be "0" (similar to FIG. 12).

Circumstances will be different though in a case of an initial state as "0" (upper side of FIG. 20) If the toggle operation is successful, since the initial state is toggled to "1" by the first toggle operation in Step S44, Vref2 (1st) and Vref2 (2nd) are supposed to be Vref2 (1st)<Vref2 (2nd). In this case, the output signal Q2 of the first latch circuit 47b should be "0" (similar to FIG. 12). In addition, even though the toggle operation is failed, Vref2 (1st) and Vref2 (2nd) are supposed to be Vref2 (1st)<Vref2 (2nd). In this case, the output signal Q2 of the first latch circuit 47b should be "0" (similar to FIG. 12).

As explained in FIGS. 19 and 20, it is possible to determine whether or not the first toggle operation is normally executed in Step S44 by the output signal Q1 of the first latch circuit 47a and the output signal Q2 of the first latch circuit 47a. That is, if the output signal Q1 is consistent with the output signal Q2, the determination circuit 48a determines that the toggle operation was normally executed (Step S46: yes). The toggle error signal TGERR is outputted as "0" by the determination circuit 48a. Whereas, if the output signal Q1 is not consistent with the output signal Q2, the determination circuit 48a determines that the toggle operation was not executed normally (Step S46: no). The toggle error signal TGERR is outputted as "1" by the determination circuit 48a.

Next, the determination circuit 48a obtains a magnitude relation between the Rref (1st) and the Rref (2nd) (=a magnitude relation between the Rref1 (1st) and the Rref1 (2nd)=a magnitude relation between the Rref2 (1st) and the Rref2 (2nd)). That is, the determination circuit 48a determines whether the output signals Q1 and Q2 that are equal to each other are "0" (which means Rref (1st)<Rref (2nd)) or "1" (which means Rref (1st)>Rref (2nd)) (Step S48).

If the state is toggled from the initial state of "0" to "1", Vref (1st) and Vref (2nd) are supposed to be Vref (1st)<Vref (2nd) (Step S48: yes). Accordingly, the output signals Q1 and Q2 are made to be in "0" level. On the contrary, if the state is toggled from initial state of "1" to "0", Vref(1st) and Vref (2nd) are supposed to be Vref (1st)>Vref (2nd) (Step S48: no). Accordingly, the output signals Q1 and Q2 are made to be in "1" level.

If the output signals Q1 and Q2 are equal to the reference signal (to be stored) (Step S49: yes, and Step S51: yes), a signal TG2EN to execute the second toggle operation is activated by the determination circuit 48a. Therefore, the second toggle operation is executed (Step S50 and Step S52). If the output signals Q1 and Q2 are different from the reference signal (to be stored), the signal TG2EN is inactivated.

FIG. 18 shows a truth table of the determination circuit 48a. The output signal DOUT, the second toggle enable signal TG2EN and the toggle error signal TGERR are outputted on the basis of the output signals Q1 and Q2 and a state of the reference signal which indicates data to be stored in the reference cell.

IDs 2, 3, 6 and 7 show error determinations of the first toggle operation in Step S46. The ID 1 shows that the reference information is "0", the initial state is "0", the first toggle operation has no error, and the second toggle operation is required. The ID 4 shows that the reference information is "0", the initial state is "1", the first toggle operation has no error, and the second toggle operation is not required. The ID 5 shows that the reference information is "1", the initial state is "0", the first toggle operation has no error, and the second toggle operation is not required. The ID 8 shows that the reference information is "1", the initial state is "1", the first toggle operation has no error, and the second toggle operation is required.

It is made possible to program the reference information with high reliability for the reference cell in the toggle MRAM by using the second sense amplifier 3 mentioned above.

Figure 21:
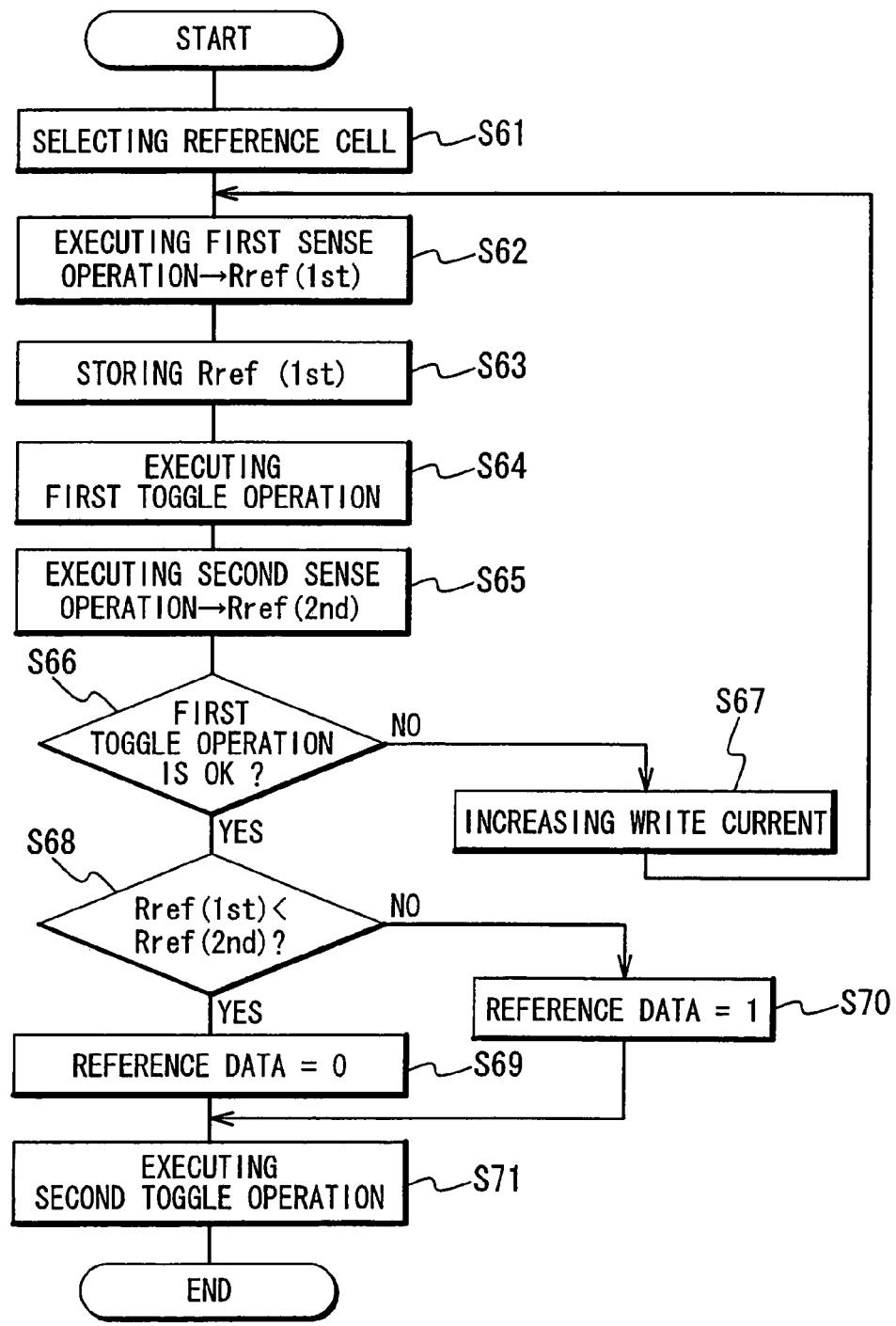
FIG. 21 is a flowchart showing a read-out operation of the second embodiment of the toggle MRAM according to the present invention.

FIG. 21 is a flowchart showing the second embodiment of the toggle MRAM according to the present invention FIG. 21 shows a sense method (a read-out method) of the reference cell of the toggle MRAM.

(1) Step S61

The X decoder 8 selects the selected read-out word line 24s. The Y decoder 6 selects the reference bit line 21r. The selected reference cell 14rs is therefore selected. The MOS transistor 26 of the selected reference cell 14rs is turned on.

(2) Step S62

The read-out operation (the first sense operation) is executed for the selected reference cell 14rs. That is, the second sense amplifier 3 (the first and second resistance-voltage converters 31a and 31b) applies the predetermined voltage between the second sense amplifier 3 and the selected reference cell 14rs (ground) so as to cause the reference read-out current Ir to flow in the path from the main reference bit line 28 to the selected reference cell 14rs through the Y decoder 6 and the reference bit line 21r. As a result, the first and second resistance-voltage converters 31a and 31b of the second sense amplifier 3 detect the resistance values Rref1 (1st) and Rref2 (1st) of the magnetic tunneling junction element 25r of the selected reference cell 14rs, respectively.

(3) Step S63

The first and second storage units 32a and 32b of the second sense amplifier 3 temporarily store the resistance values Rref1 (1st) and Rref2 (1st), respectively.

(4) Step S64

The write operation (the first toggle operation) is executed for the selected reference cell 14rs. The write operation (the toggle operation) is as described in the explanations of FIGS. 4 to 6.

(5) Step S65

The first and second resistance-voltage converters 31a and 31b of the second sense amplifier 3 again execute the read-out operation (the second sense operation) for the selected reference cell 14rs. Therefore, the first and second resistance-voltage converters 31a and 31b of the second sense amplifier 3 detect the resistance values Rref1 (2nd) and Rref2 (2nd) of the magnetic tunneling junction element 25r of the selected reference cell 14rs, respectively.

(6) Step S66

The first determination unit 33a of the second sense amplifier 3 outputs the signal Q1 which indicates the magnitude relation between the resistance values Rref1 (1st) and Rref1 (2nd). The second determination unit 33b outputs the signal Q2 which indicates the magnitude relation between the resistance values Rref2 (1st) and Rref2 (2nd). The determination circuit 48a determines whether or not the signal Q1 is consistent with the signal Q2. If the signal Q1 is consistent with the signal Q2 (Step S66: yes), the first toggle operation has been normally executed, thereby the process goes on to Step S48. If the signal Q1 is not consistent with the signal Q2 (Step S66: no), the first toggle operation has not been normally executed, thereby the process goes on to Step S67.

(7) Step S67

Because the first toggle operation has not been executed normally, the write current $I_{WL}$ and the write current $I_{BL}$ are increased by a predetermined amount so as to start from Step S62 again.

(8) Step S68

The determination circuit 48a of the second sense amplifier 3 obtains a magnitude relation between the Rref (1st) and the Rref (2nd) (=a magnitude relation between the Rref1 (1st) and the Rref1 (2nd)=a magnitude relation between the Rref2 (1st) and the Rref2 (2nd)). That is, it is determined whether the signal Q1 and the signal Q2 that are equal to each other are "0" or "1".

(9) Step S69

If it is assume that a low resistance case is "0" and a high resistance case is "1", the read-out result (the sense result) should be "0" under Rref (1st)<Rref (2nd) (Step S68: yes). That is, the original data of the selected reference cell 14rs (before the write operation in Step S64) is "0". However, the data of the selected reference cell 14rs is "1" at Step S69.

(10) Step S70

The read-out result (the sense result) should be "1" under Rref(1st)>Rref(2nd) (Step S68: no). That is, the original data of the selected reference cell 14rs (before the write operation in Step S64) is "1". However, the data of the selected reference cell 14rs is "0" at Step S70.

(11) Step S71

The write operation (the second toggle operation) is again executed for the selected reference cell 14rs. The write operation (the toggle operation) is as described in the explanations of FIGS. 4 to 6. Data of the selected reference cell 14rs are thus returned to the original data.

In the second sense amplifier shown in FIG. 16, it is possible to use the sense result DOUT of the determination circuit 48a as the read-out data in Step S69 or Step S70 in a case of the read-out operation of FIG. 21. That is, it is possible to read out the data of the reference cell in the toggle MRAM without comparing with data of other cells by using the second sense amplifier 3 mentioned above.

Although the embodiments of the present invention has been mentioned above, concrete configurations are not limited to the embodiments mentioned above, and it is possible to change a design of the present invention within a range not exceeding scopes of the present invention. For example, a configuration of the memory cell is not limited to the one shown in FIG. 8, and a cross-point type memory cell without having a selected transistor as well known by those skilled in the art may be an alternative choice. In the second embodiment, the offset voltage in the second sense operation may be added or reduced in the first and the second resistance-voltage converter circuits.

The invention claimed is:

1. A magnetoresistive random access memory comprising:
a plurality of first wirings which is extended in a first direction;
a plurality of second wirings which is extended in a second direction which is substantially perpendicular to said first direction;
a plurality of memory cells, each of which is placed correspondingly to each of positions where said plurality of first wirings is crossed with said plurality of second wirings;
a second sense amplifier which detects a state of a reference cell on the basis of an output from said reference cell provided by corresponding to a reference wiring among said plurality of second wirings, among said plurality of memory cells; and
a first sense amplifier which detects a state of one of said plurality of memory cells on the basis of an output from said reference cell and an output from said one of the plurality of memory cells, which is different from said reference cell,
wherein each of said plurality of memory cells includes a magnetic tunneling junction element having a laminated free layer in which a magnetization direction is reversed correspondingly to data to be stored,
wherein said magnetic tunneling junction element has a magnetization easy axis direction which is different from said first and second directions, and
wherein a toggle operation to reverse a magnetization of said laminated free layer, for a selected cell as one of plurality of memory cells which corresponds to a selected first wiring selected among said plurality of first wirings and a selected second wiring selected among said plurality of second wirings, is executed by a series of current controls in which a first write current is supplied to said selected first wiring followed by a second write current to be supplied to said selected second wiring next, then, said first write current is stopped followed by said second write current to be stopped, wherein said first write current and said second write current are larger in said toggle operation executed for said reference cell than in said toggle operation executed for one of said plurality of memory cells which is different from said reference cell.

2. The magnetoresistive random access memory according to claim 1, wherein a stored information of said reference cell is read out by executing a first read-out operation to detect a first state as an initial state of said reference cell, a first toggle operation to bring said reference cell into a second state by said toggle operation, a second read-out operation to detect said second state of said reference cell, and a second toggle operation to return said reference cell to said first state by said toggle operation, thereby stored information of the reference cell is read out on the basis of a comparison result between said first state and said second state.

3. The magnetoresistive random access memory according to claim 2, wherein said second sense amplifier includes:
a resistance voltage converter which detects a resistance value of said magnetic tunneling junction element of said reference cell so as to convert to an output voltage,
a storage unit which temporarily stores said output voltage, and
a determination unit which determines said stored information which has been stored in said reference cell on the basis of said output voltage after said toggle operation and said output voltage before said toggle operation stored in said storage unit.

4. The magnetoresistive random access memory according to claim 3, wherein said storage unit includes:
a first switch unit which is connected to an output side of said resistance voltage converter at an input side, and
a capacitor which is connected to an output side of said first switch at an input side,
wherein said determination unit includes:
an inverter which is connected to an output side of the capacitor at an input side, and
a second switch unit which is connected in parallel between an input and said output of said inverter.

5. The magnetoresistive random access memory according to claim 4, wherein both said first switch unit and said second switch unit are in an on state in said first read-out operation,
wherein said first switch unit is in an off state before starting said second read-out operation,
wherein said first switch unit is again brought into an on state immediately after said second switch unit is brought into an off state in said second read-out operation, and
wherein an output of said inverter in said second read-out operation is said stored information of said reference cell.

6. The magnetoresistive random access memory according to claim 2, wherein said second sense amplifier detects whether or not said first toggle operation is executed, and increases said first write current and said second write current if it is determined that said first toggle operation is not executed to start from said first read-out operation again.

7. The magnetoresistive random access memory according to claim 6, wherein said second sense amplifier includes:
a first resistance voltage converter which detects a resistance value of said magnetic tunneling junction element of said reference cell as a first output voltage, a first storage unit which temporarily stores said first output voltage, a first determination unit which determines said stored information stored in said reference cell and outputs a determination result as a first signal on the basis of said first output voltage after said toggle operation and said first output voltage before said toggle operation stored in said first storage unit, a second resistance voltage converter which detects a resistance value of said magnetic tunneling junction element of said reference cell as a second output voltage, a second storage unit which temporarily stores said second output voltage, a second determination unit which determines said stored information stored in said reference cell and outputs a determination result as a second signal on the basis of said second output voltage after said toggle operation and said second output voltage before said toggle operation stored in said second storage unit, and a determination unit which determines whether or not said first toggle operation has been executed on the basis of said first signal and said second signal.

8. The magnetoresistive random access memory according to claim 7, wherein said first output voltage in said first read-out operation is obtained by adding a first offset voltage to a voltage to which a detected resistance value of said magnetic tunneling junction element is converted, wherein said first output voltage in said second read-out operation is obtained by detecting a resistance value of said magnetic tunneling junction element and converting it to a voltage, wherein said second output voltage in said first read-out operation is obtained by adding a second offset voltage to a voltage to which a detected resistance value of said magnetic tunneling junction element is converted, wherein said second output voltage in said second read-out operation is obtained by detecting a resistance value of said magnetic tunneling junction element and converting it to a voltage, and wherein a sign of said first offset voltage is opposite to that of said second offset voltage.

9. The magnetoresistive random access memory according to claim 8, wherein said first storage unit includes:

a first switch unit which is connected to an output side of said first resistance voltage converter at an input side, and a first capacitor which is connected to an output side of said first switch unit at an input side, wherein said first determination unit includes:

a first inverter which is connected to an output side of said first capacitor at an input side, and a second switch unit which is connected in parallel between an input and an output of said first inverter, wherein said second storage unit includes:

a third switch unit which is connected to an output side of said first resistance voltage converter at an input side, and a second capacitor which is connected to an output side of said third switch at an input side, wherein said second determination unit includes:

a second inverter which is connected to an output side of the second capacitor at an input side, and a forth switch unit which is connected in parallel between an input and an output of said second inverter.

10. The magnetoresistive random access memory according to claim 9, wherein said first switch unit, said second switch unit, said third switch unit and said forth switch unit are in an on state in said first read-out operation, wherein said first switch unit and said third switch unit are in an off state before starting the second read-out operation, wherein said first switch unit and said third switch unit are brought into an on state again immediately after said second switch unit and said fourth switch unit are brought into an off state in said second read-out operation, and wherein an output of said determination unit in said second read-out operation is said stored information of said reference cell.

11. The magnetoresistive random access memory according to claim 7, wherein said first output voltage in said first read-out operation is obtained by adding a first offset voltage to a voltage to which a detected resistance value of said magnetic tunneling junction element has been converted, wherein said first output voltage in said second read-out operation is obtained by detecting a resistance value of the magnetic tunneling junction element and converting it to a voltage, wherein said second output voltage in said first read-out operation is obtained by detecting a resistance value of said magnetic tunneling junction element and converting it to a voltage, wherein said second output voltage in said second read-out operation is obtained by adding a second offset voltage to a voltage to which a detected resistance value of said magnetic tunneling junction element has been converted, and wherein a sign of said first offset voltage is equal to that of said second offset voltage.

12. The magnetoresistive random access memory according to claim 1, wherein a stored information of said reference cell is written by executing a first read-out operation to detect a first state as an initial state of said reference cell, a first toggle operation to bring said reference cell into a second state by said toggle operation, a second read-out operation to detect said second state of said reference cell, and a determination operation to determine said first state and said second state on the basis of a comparison result between said first state and said second state, thereby said second state is retained if said second state is equal to said stored information to be written to said reference cell, and said toggle operation is executed to return said reference cell to said first state if said second state is different from said stored information to be written to said reference cell, for writing.

13. A magnetoresistive random access memory comprising:

a first wiring which is extended in a first direction;

a plurality of second wirings which is extended in a second direction which is substantially perpendicular to said first direction;

a plurality of memory cells, each of which is placed correspondingly to each of positions where said first wiring is crossed with said plurality of second wirings;

a reference cell which is placed correspondingly to a reference wiring among said plurality of second wirings;

wherein each of said plurality of memory cells and said reference cell includes a magnetic tunneling junction element in which a magnetization direction is reversed correspondingly to data to be stored, wherein said magnetic tunneling junction element has a magnetization easy axis direction which is different from said first and second directions, wherein said reference cell undergoes an operation comprising:
executing a first read-out operation to detect a first state as an initial state of said reference cell,
executing a first toggle operation to bring said reference cell into a second state by an toggle operation,
executing a second read-out operation to detect said second state of said reference cell,
judging whether said reference cell is in said first state or said second state on the basis of a comparison result between said first state and said second state,
wherein said toggle operation is executed by a series of current controls which includes:
supplying a first write current to said first wiring,
supplying a second write current to one of said plurality of second wirings,
stopping said first write current, and
stopping said second write current.

14. The magnetoresistive random access memory according to claim 13, wherein after said judging operation is executed, a second toggle operation is executed to return said reference cell to said first state by said toggle operation.

15. The magnetoresistive random access memory according to claim 13, wherein after said judging operation is executed, said second state is retained if said second state is equal to a stored information to be written to said reference cell, and a second toggle operation is executed to return said reference cell to said first state if said second state is different from said stored information to be written to said reference cell, for writing said stored information to said reference cell.

16. An operation method of a magnetoresistive random access memory, wherein said magnetoresistive random access memory includes:
a plurality of memory cells, each of which is placed correspondingly to each of positions where a first wiring extended in a first direction is crossed with a plurality of second wirings extended in a second direction which is substantially perpendicular to said first direction, and
a reference cell which is placed correspondingly to a reference wiring among said plurality of second wirings;
said operation method comprising:
executing a first read-out operation to detect a first state as an initial state of said reference cell,
executing a first toggle operation to bring said reference cell into a second state by a toggle operation,
executing a second read-out operation to detect said second state of said reference cell,
judging whether said reference cell is in said first state or said second state on the basis of a comparison result between said first state and said second state,
wherein said toggle operation is executed by a series of current controls which includes:
supplying a first write current to said first wiring,
supplying a second write current to one of said plurality of second wirings,
stopping said first write current, and
stopping said second write current.

17. The operation method of the magnetoresistive random access memory according to claim 16, further comprising:
executing a second toggle operation to return said reference cell to said first state by said toggle operation after said judging operation.

18. The operation method of the magnetoresistive random access memory according to claim 16, further comprising:
retaining said second state if said second state is equal to a stored information to be written to said reference cell, and executing a second toggle operation to return said reference cell to said first state if said second state is different from said stored information to be written to said reference cell, for writing said stored information to said reference cell, after said judging operation.

* * * * *